(12) United States Patent
Gilbert

(10) Patent No.: US 6,525,601 B2
(45) Date of Patent: Feb. 25, 2003

(54) INPUT SYSTEM FOR VARIABLE GAIN AMPLIFIER HAVING TRANSCONDUCTANCE STAGES WITH FEEDFORWARD PATHS DIVERTED TO AC GROUND

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/170,067

(22) Filed: Jun. 11, 2002

(65) Prior Publication Data

US 2002/0153937 A1 Oct. 24, 2002

Related U.S. Application Data

(62) Division of application No. 09/569,544, filed on May 12, 2000, now Pat. No. 6,429,720.

(51) Int. Cl.[7] .................................. G06G 7/12
(52) U.S. Cl. ....................................... 327/560
(58) Field of Search ............................ 327/560, 561, 327/562, 563

(56) References Cited

U.S. PATENT DOCUMENTS

| | | | | |
|---|---|---|---|---|
| 5,077,541 A | * | 12/1991 | Gilbert ........................ | 330/144 |
| 5,359,293 A | | 10/1994 | Boksiner et al. ............ | 324/544 |
| 5,473,244 A | | 12/1995 | Libove et al. ............... | 324/126 |
| 5,684,431 A | * | 11/1997 | Gilbert et al. .............. | 330/254 |
| 6,204,719 B1 | | 3/2001 | Gilbert ........................ | 327/349 |
| 6,445,248 B1 | * | 9/2002 | Gilbert ........................ | 330/51 |

OTHER PUBLICATIONS

Analog Devices *High Precision, Wide–Band RMS–to–DC Converter (AD637) Rev. E*, 10 pages, 1999.
Analog Devices data sheets entitled "Dual, Low Noise, Wideband Variable Gain Amplifiers", AD600/AD602, Rev. A, 20 pages, published Apr. 1992.
Analog Devices data sheets entitled "Low Level, True RMS–to–DC Converter", AD636, Rev. A, 8 pages, published Sep. 1992.
Analog Devices data sheets for 60 MHz, *2000 V/μS Monolithic Op Amp AD844*, 12 pages, 1990.

* cited by examiner

*Primary Examiner*—Jeffrey Zweizig
(74) *Attorney, Agent, or Firm*—Marger Johnson & McCollom, P.C

(57) ABSTRACT

An input system for a variable gain amplifier using a continuously interpolated attenuator includes a plurality of gm stages in which the collector current from one transistor in each gm stage is diverted to AC ground, thereby eliminating a feedforward path and providing flat frequency response at very high frequencies. An additional feedforward path through the parasitic emitter capacitances in each gm stage is eliminated by a filter capacitor coupled the common emitter node of each gm stage. A compensation transistor included in each gm stage provides a differential output signal which can be used to cancel common mode feedforward signals which are coupled to the output through the collector-junction capacitances of the gm stages. The effects of parasitic capacitances are further reduced by reverse biasing the gm stages that are off.

45 Claims, 14 Drawing Sheets

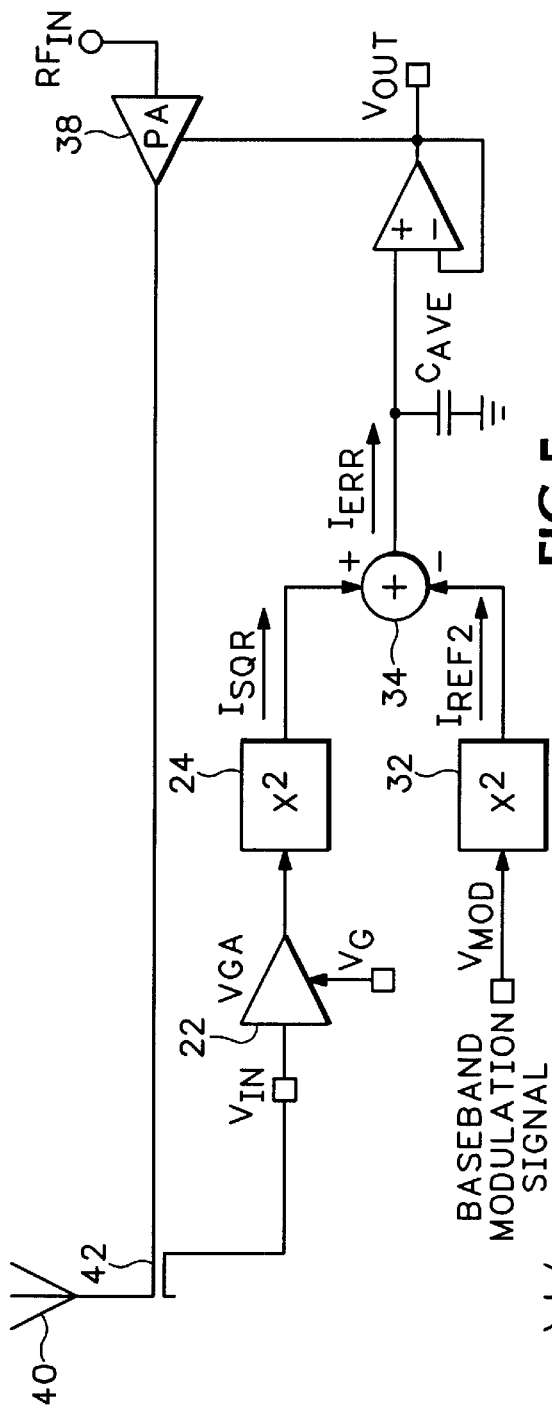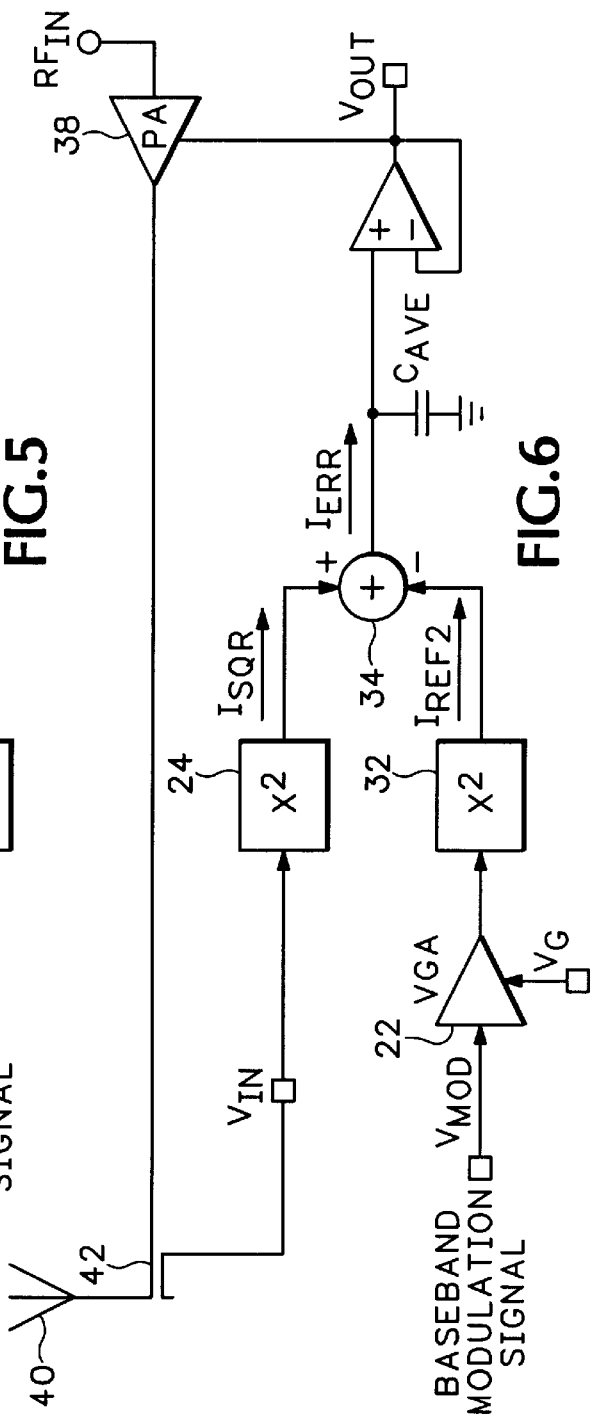

INPUT SYSTEM FOR VARIABLE GAIN AMPLIFIER HAVING TRANSCONDUCTANCE STAGES WITH FEEDFORWARD PATHS DIVERTED TO AC GROUND

This application is a divisional of prior application Ser. No. 09/569,544 filed May 12, 2000, now U.S. Pat. No. 6,429,720 which is herein incorporated by reference.

BACKGROUND OF THE INVENTION

FIG. 1 is a schematic diagram of a prior art RMS-DC converter system. The system of FIG. 1 includes an RMS-DC converter subsystem 10, a variable gain amplifier (VGA) 12, and an operational amplifier (op amp) 14.

The subsystem 10 performs an implicit RMS computation and includes an absolute value/voltage-current converter 16, a one-quadrant squarer/divider 18, and a current mirror 20. The input voltage $V_1$, which can be either AC or DC, is converted to a unipolar current $I_1$ by an active rectifier formed by op amps A1 and A2. The current $I_1$ drives the input of the squarer/divider. The output current $I_4$ of the squarer/divider drives the current mirror through a low-pass filter formed by resistor R1 and capacitor $C_{AV}$. If the R1,$C_{AV}$ time constant is much greater than the longest period of the input signal, then $I_4$ is effectively averaged.

The current mirror returns a current $I_3$, which equals the average of $I_4$, back to the squarer/divider to complete the implicit RMS computation. The current mirror also produces the output current $I_{OUT}$, which can be used directly or converted to a voltage with $R_L$. An optional dB output can be derived from the emitter of Q3 since the voltage at this point is proportional to -log $V_1$. Emitter follower transistor Q5 buffers and level shifts this voltage so that the dB output voltage is zero when the externally supplied emitter current $I_{REF}$ to Q5 approximates $I_3$.

The RMS subsystem 10 of FIG. 1 can operate independently as a complete RMS-DC converter. However, it suffers from numerous problems such as limited dynamic range, and bandwidth that depends on the signal level. To overcome these problems, the system of FIG. 1 utilizes the RMS subsystem as merely the detector element in an automatic gain control (AGC) loop in which the difference between the RMS output of the subsystem 10 and a fixed DC reference are nulled in a loop integrator. The loop integrator includes an op amp 16 and a variable gain amplifier (VGA) 12. The op amp generates the output voltage $V_{OUT}$ in response to the output voltage $V_{RMS}$ from the RMS subsystem and the reference voltage $V_{REF}$. Resistors R6 and R7 divide $V_{OUT}$ to generate the gain control signal $V_G$, which controls the gain of the VGA. The dynamic range and accuracy with which the signal can be determined are now entirely dependent on the VGA. Since the input to the RMS subsystem is forced to a constant amplitude, close to its maximum input capability, the bandwidth is no longer signal dependent.

Although the system of FIG. 1 can perform wide dynamic range RMS-DC measurements, it suffers from other limitations. For example, the circuitry in the RMS subsystem limits the maximum frequency at which the system can operate. There is also some redundancy, inasmuch as there is no need to compute the full root mean-square value.

SUMMARY

In one aspect of the present invention, an RMS-DC converter utilizes a variable gain amplifier to drive a squaring cell. In another aspect of the present invention, an RMS-DC converter drives a first squaring cell with a variable gain amplifier and drives a second squaring cell with a reference signal. In a further aspect of the present invention, an RMS-DC converter drives a first detector with a signal to be measured, and a second detector with a replica signal. In another aspect of the present invention, a variable gain amplifier is utilized to amplify either the signal to be measured or the replica signal.

In an additional aspect of the present invention, an input system for a continuously interpolated amplifier includes gm stages wherein the current from one of the transistors in each gm stage is diverted to an AC ground through a feedforward path.

BRIEF DESCRIPTION OF THE DRAWINGS

FIG. 5 is a simplified schematic diagram of an embodiment of an RMS-DC converter utilizing a replica signal in the reference signal path and a variable gain amplifier in the input signal path in accordance with the present invention.

FIG. 6 is a simplified schematic diagram of an embodiment of an RMS-DC converter utilizing a replica signal and a variable gain amplifier in the reference signal path in accordance with the present invention.

DETAILED DESCRIPTION

Figure 1:
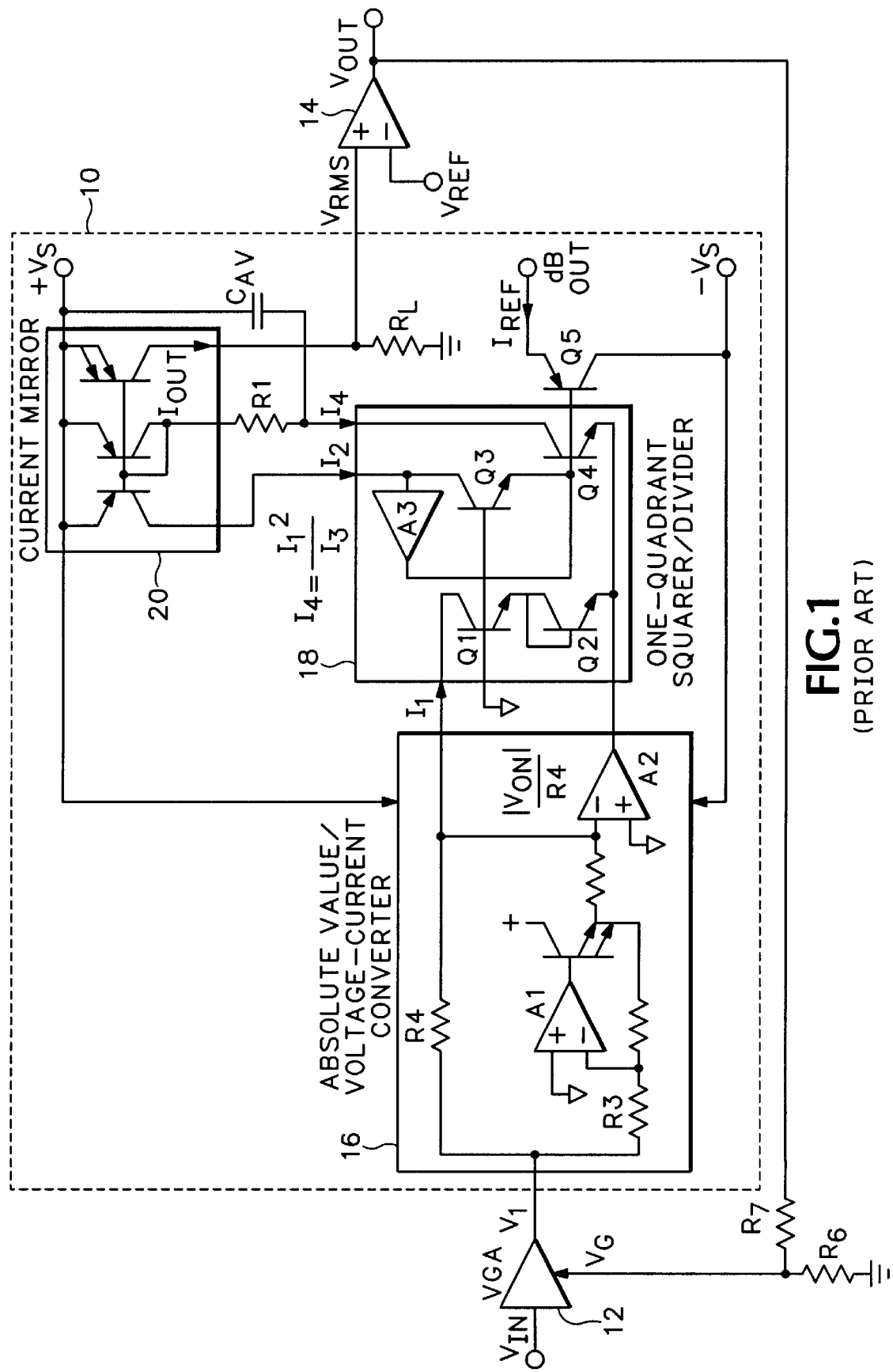
FIG. 1 is a schematic diagram of a prior art RMS-DC converter system.
Figure 2:
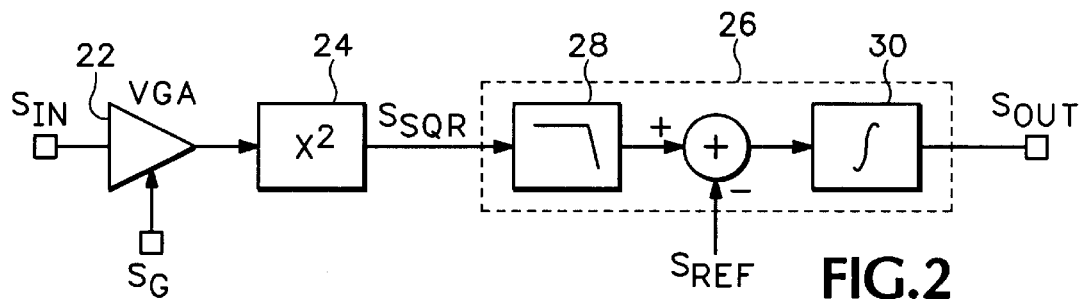
FIG. 2 is a block diagram of an embodiment of an RMS-DC converter in accordance with the present invention.

FIG. 2 is a block diagram of an embodiment of an RMS-DC converter in accordance with the present invention. The system of FIG. 2 includes a variable gain amplifier (VGA) 22, which amplifies the input signal $S_{IN}$ with a gain determined by a gain control signal $S_G$. The output from the VGA drives a squaring cell 24, which generates an output signal (or "squared" signal) $S_{SQR}$. An averaging circuit 26 generates the final output signal $S_{OUT}$ in response to $S_{SQR}$ and a reference signal $S_{REF}$. These signals may be in either voltage-mode or current-mode form.

The circuit of FIG. 2 can be configured for operation in a measurement mode, in which case the output signal $S_{OUT}$ is fed back to the VGA and used as the gain control signal $S_G$. It can also be configured in a controller mode, in which case the output signal $S_{OUT}$ is used to control the gain or power of a device such as a radio frequency (RF) power amplifier. In controller mode, a sample of the output from the power amplifier is fed back to the input terminal of the VGA as the input signal $S_{IN}$, and the control signal $S_G$ is then used as a set-point signal.

In either mode, the system servoes until the average of $S_{SQR}$ equals the reference signal $S_{REF}$. The final output signal $S_{OUT}$ is then a quasi-DC signal that provides an accurate measure of the power of the input signal $S_{IN}$. If the VGA is realized with linear gain control, i.e., the gain varies in proportion to the gain control signal $S_G$, then $S_{OUT}$ is a linear measure of the power of $S_{IN}$. By realizing the VGA with exponential gain control, the system can be made to provide an output signal, which is linear-in-dB, that is, a logarithmic function.

An advantage of the system of FIG. 2 is that the squaring cell can be implemented as a simple transconductance cell such as those disclosed in U.S. patent application Ser. No. 09/245,051 filed Feb. 4, 1999, Ser. No. 09/256,640 filed Feb. 24, 1999; and Ser. No. 09/514,831, filed Feb. 28, 2000 entitled "RMS-DC Converter Having Detector Cell With Dynamically Adjustable Scaling Factor", which are by the same inventor as the present application, and are incorporated herein by reference. The use of a simple squaring cell allows the system of FIG. 2 to operate accurately at very high frequencies, and with input signals having high crest factors.

If the system is used for RF applications, the averaging circuit may need to accommodate two types of averaging: RF ripple filtering of the carrier signal, and long-term averaging of the modulation envelope. In the embodiment of FIG. 2, the averaging circuit 26 is shown with a low-pass filter 28 which performs the RF ripple filtering, and an integrating circuit 30 which provides the long-term averaging by integrating the difference between the filtered signal from the low-pass filter and the reference signal $S_{REF}$. However, the averaging circuit 26 can be implemented in many different ways, and even though the low-pass filter and integrating circuit are shown as separate circuits in FIG. 2, their functions can be combined in a single component in some implementations, or performed inherently in other implementations.

Figure 3:
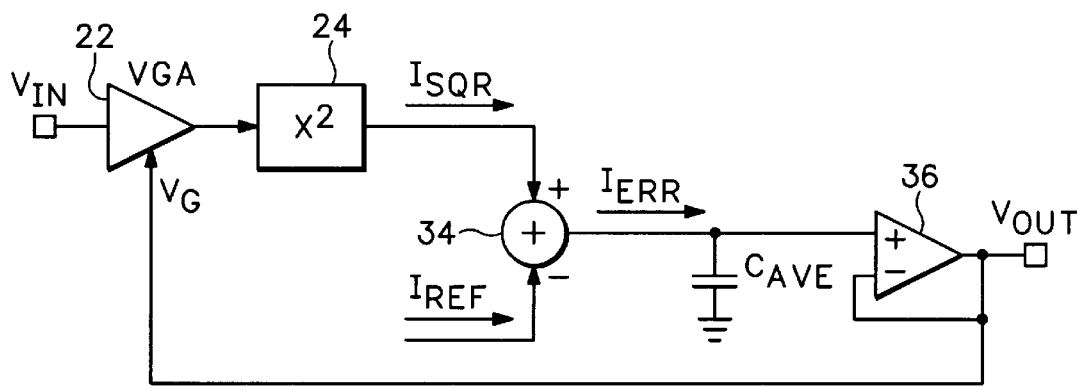
FIG. 3 is a simplified schematic diagram of an embodiment of a practical implementation of the system of FIG. 2.

FIG. 3 is a simplified schematic diagram showing more details of one possible practical implementation of the system of FIG. 2. In the system of FIG. 3, the input signal, final output signal, and gain control signal are voltages, while the squared signal and reference signal are currents. The averaging circuit is implemented with an adder 34, an averaging capacitor $C_{AVE}$, and unity gain a buffer amplifier 36. These signal types and circuit elements are chosen for illustrative purposes, and the system of FIG. 2 is not limited to such an implementation. Moreover, the system of FIG. 3 is shown configured in a measurement mode, but it could also be configured as a controller as well.

Referring again to FIG. 3, the reference signal $I_{REF}$ is subtracted from the squared signal $I_{SQR}$ by adder 34, thereby generating an error signal $I_{ERR}$. The error signal $I_{ERR}$ is averaged by $C_{AVE}$, which also performs an integrating function. The buffer 36 generates the final output signal $V_{OUT}$ which is fed back to the VGA as the gain control signal.

To provide accurate operation over a wide range of temperatures, the systems of FIGS. 2 and 3 should preferably be designed to compensate for variations in the output characteristics of the squaring cell caused by changes in operating temperature. One technique for providing temperature compensation is by utilizing a squaring cell made from two overlapping squaring cells driven by tail currents having different temperature characteristics as disclosed in the above-referenced U.S. patent application Ser. No. 09/514,831, filed Feb. 28, 2000 entitled "RMS-DC Converter Having Detector Cell With Dynamically Adjustable Scaling Factor", which is incorporated by reference.

Figure 4:
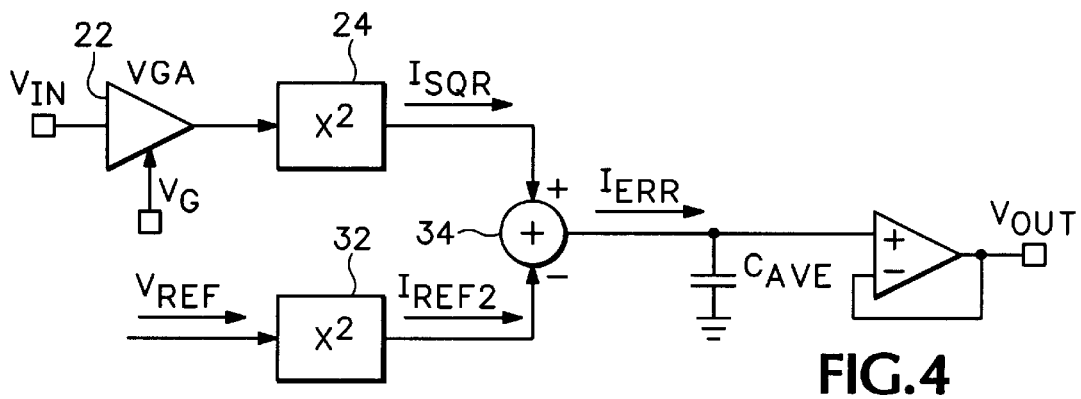
FIG. 4 is a simplified schematic diagram of another embodiment of an RMS-DC converter having a second squaring cell in accordance with the present invention.

Another technique for compensating for temperature changes in the squaring cell is employed by the system of FIG. 4, which is a simplified schematic diagram of another embodiment of an RMS-DC converter in accordance with the present invention. The system of FIG. 4 is similar to that of FIG. 3, but now a reference signal in the form of a voltage $V_{REF}$ is first squared by an identical transconductance squaring cell 32 before being applied to the averaging circuit as the current $I_{REF2}$. This imparts a temperature dependency in $I_{REF2}$ which matches the temperature dependency of $I_{SQR}$ from the first squaring cell, so the individual temperature dependencies of the two squaring cells are cancelled.

In a preferred embodiment, the two squaring cells are fabricated on an integrated circuit in a cross-quad arrangement to cancel the effects of thermal and doping gradients. The squaring cells should also be balanced through the use of common biasing and balancing schemes such as those disclosed in U.S. patent application Ser. Nos. 09/245,051 and 09/256,640 discussed above.

The system of FIG. 4 can be configured for operation in either a measurement mode or a controller mode. For illustrative purposes, the system of FIG. 4 is shown with signal types and an averaging circuit similar to those of the system of FIG. 3. However, the system shown in FIG. 4 can be expanded to include more generalized signal types, i.e., $S_{IN}$, $S_{REF}$, etc., and a more generalized averaging circuit as shown in FIG. 2.

A common problem with some squaring cells is that they lose accuracy at high input signal levels. That is, at lower input levels, the output from the squaring cell conforms closely to a true square law, but as the input signal increases, the actual output departs from a true square law, and for some topologies of the squaring cell, the output can reach a range of operation where the output will not increase regardless of how large the input signal becomes, that is, it becomes compressive.

Errors caused by square law conformance errors can be cancelled in the system of FIG. 5, which illustrates another embodiment of an RMS-DC converter in accordance with the present invention. The system of FIG. 5 is configured to control the power output from an RF power amplifier 38 driving an antenna 40. The RF input signal $RF_{IN}$ to the power amplifier comprises a carrier signal that has been modulated by a baseband signal. A directional coupler 42 samples the power from the amplifier and uses this sample as the input signal to the VGA. A set-point signal is applied to the VGA as the gain control signal $V_G$. As with the systems of FIGS. 3 and 4, the averaging circuit in FIG. 5 is implemented with an adder, an averaging capacitor, and a buffer amplifier. However, rather than applying a fixed DC signal to the second squaring cell, the same baseband modulation signal $V_{MOD}$ that is used to modulate the carrier signal is now applied to the second squaring cell as the reference signal. In this way, all of the errors in the law-conformance of the squaring cells are cancelled when the two squaring cells 24 and 32 have similar square law characteristics. This remains true even when the law conformance is degraded at high input levels.

FIG. 6 illustrates yet another embodiment of an RMS-DC converter in accordance with the present invention. In FIG. 6, the VGA is moved to the reference signal path. An advantage of this embodiment is that the VGA need only operate at the frequency of the baseband signal rather than the carrier signal.

Again, for illustrative purposes, the systems of FIGS. 5 and 6 are shown with signal types and an averaging circuit similar to those of the system of FIG. 3. However, the systems of FIGS. 5 and 6 can be expanded to include more generalized signals, i.e., $S_{IN}$, $S_{REF}$, etc., and a more generalized averaging circuit. The same implementation details such as crossquadding the squaring cells also apply, and linear-in-dB measurement characteristic can be obtained through the use of a VGA having exponential gain control. Also, the systems of FIGS. 5 and 6 are shown controlling an RF power amplifier, but the invention is not so limited. The same principles can be used to control the RMS output of any other device that is driven by one signal modulated onto another.

In the systems shown in FIGS. 5 and 6, the VGA is not an essential component. Gain control can be provided elsewhere in the system, and the benefit derived from driving the second squaring cell with a replica of the modulation signal can be obtained by applying the modulated carrier signal and the baseband modulation signal directly to the squaring cells. However, using a VGA in either the input signal path or the reference signal path enhances the system accuracy over a wide dynamic range.

An RMS-DC converter utilizing a replica of the modulation signal in accordance with the present invention is not limited to systems utilizing squaring cells as the detectors. Other types of detectors, for example, Shottkey diodes, can be utilized. The same is true for the embodiment of FIG. 4. As long as the two detectors have similar detector laws, their conformance errors are cancelled. Also, the present invention is not limited to using a replica signal which is the exact modulation signal applied to the carrier. The replica signal applied to the detector in the reference signal path need only have the same probability density function as that of the signal being measured. However, in most practical systems, the baseband modulation signal will be the most convenient signal available for use as the replica signal.

Figure 20:
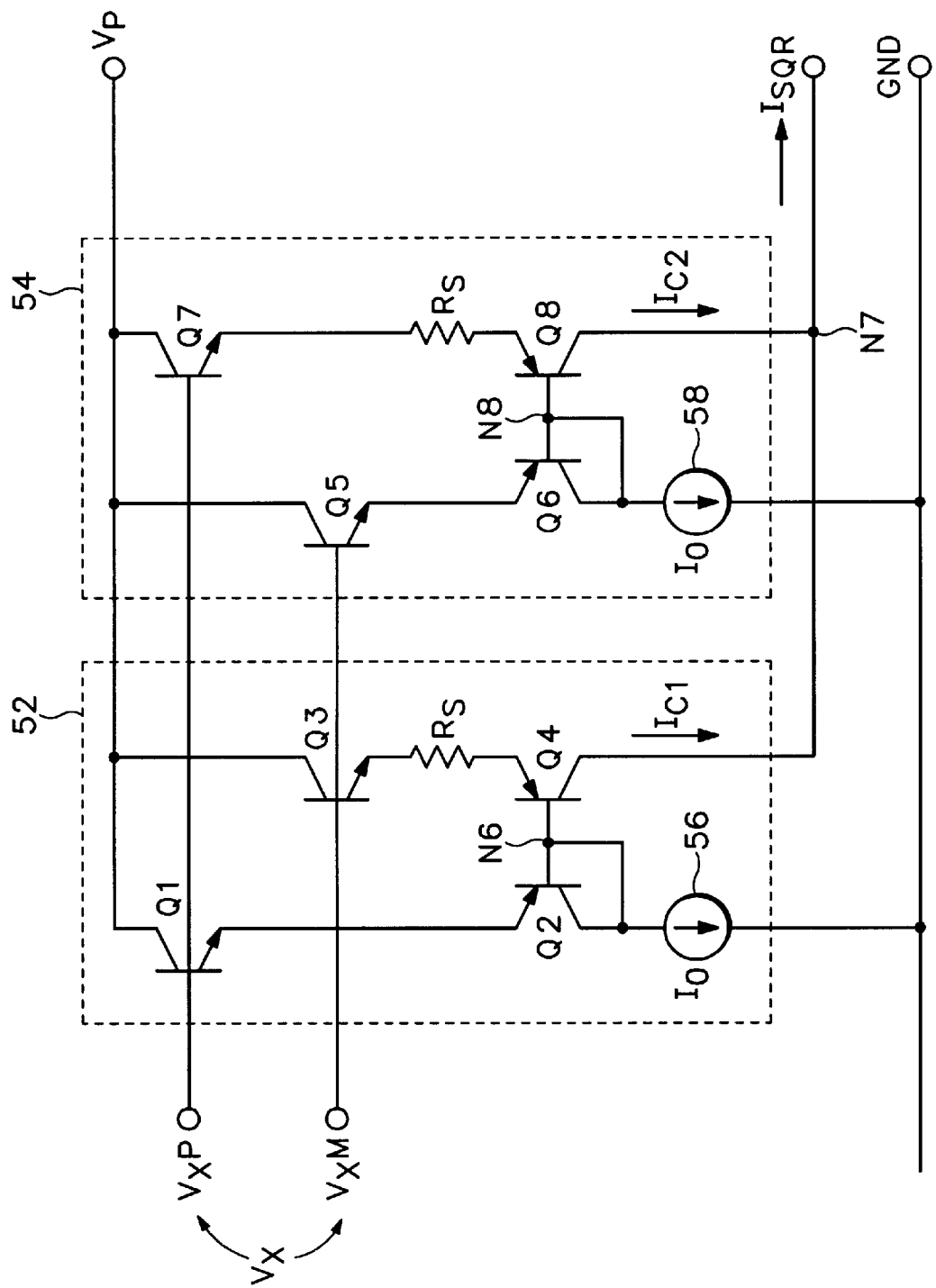
FIG. 20 is a schematic diagram of an embodiment of a squaring cell utilizing exponential current generators having transistor stacks.

In a preferred embodiment, the detector cell or cells are implemented as squaring cells formed from exponential current generators having transistor stacks as shown in FIG. 20. This type of squaring cell is described in more detail in U.S. patent application Ser. No. 09/473,309 filed Dec. 28, 1999, entitled "RMS-DC Converter Having Gain Stages With Variable Weighting Coefficients", which is by the same inventor as the present application, and is incorporated herein by reference.

When a squaring cell is used to measure a small input signal, the standing current (zero-signal current) should be as small as possible because, otherwise, the output signal is difficult to discern from the standing current. Additionally, when two squaring cells are used together, high standing currents exacerbate device mismatches and jeopardize the balance between the cells.

In the circuit of FIG. 20, the reduction in standing current that can be achieved by simply lowering $I_0$ is limited by the fact that $R_S$ cannot be made too large. Otherwise, the output of the squaring cell will become very linear in response to large input signals and the square-law behavior is lost.

Figure 21:
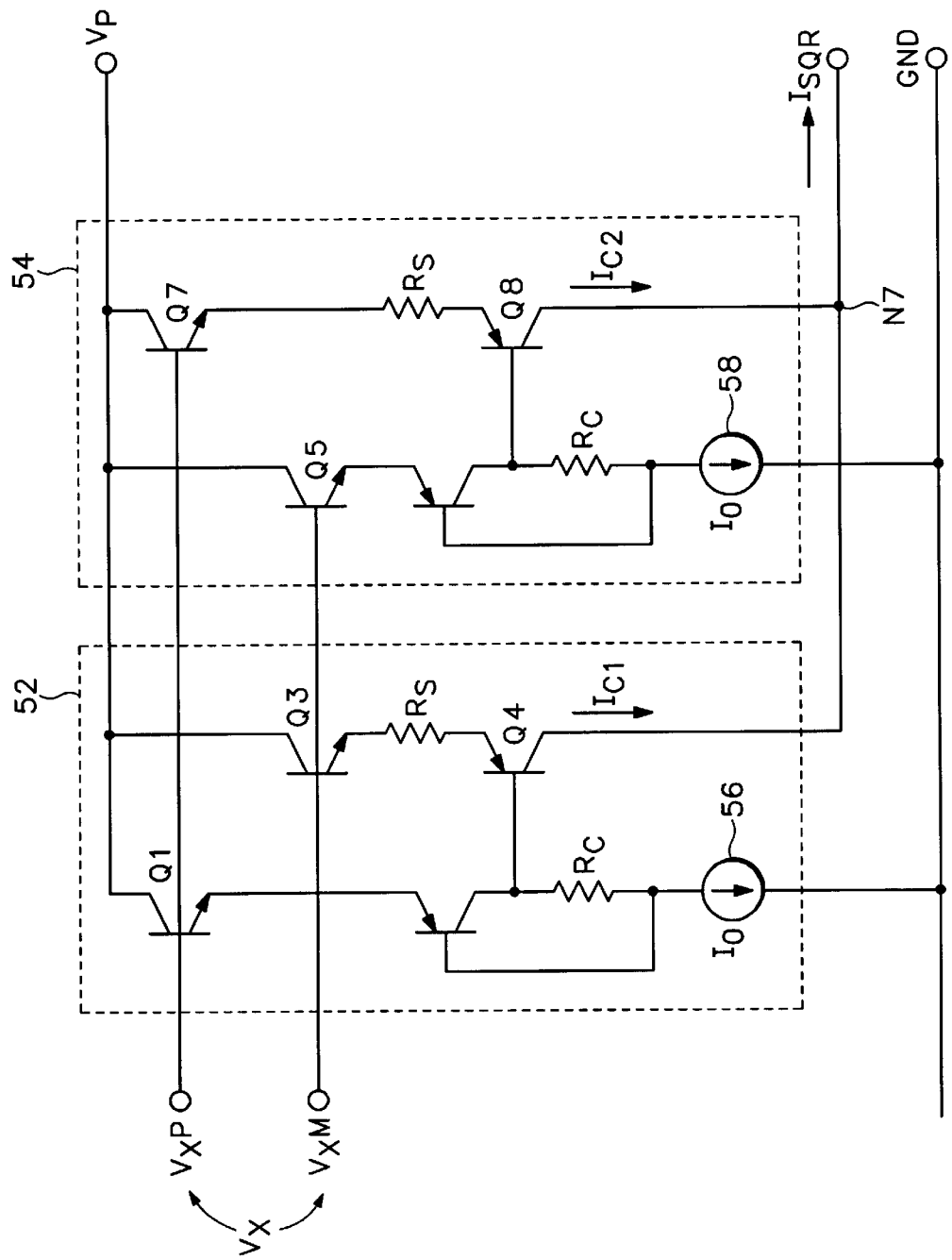
FIG. 21 is a schematic diagram of an embodiment of a squaring cell in accordance with the present invention.

This problem is overcome by the introduction of collector resistors $R_C$ in series with the collectors of Q2 and Q6 as shown in FIG. 21. The bases of Q2 and Q6 are then connected between $R_C$ and the corresponding current source. The voltage drop across the collector resistors, which serve to back-bias the entire arrangement, is independent of the input signal. By adding this precise voltage drop, the standing current can be reduced without significantly compromising the response to large input signals. Thus, the output signal caused by very small input signals can easily be discerned.

If the voltage drop across $R_C$ is made too large, the squaring cell will not respond accurately to small input signals. An optimum value will typically be about a few $V_T$, where $V_T$ is the thermal voltage (~26 mV at 300° K).

In some of the embodiments described above, a variable gain amplifier (VGA) is a key component. One type of VGA that is readily adaptable for use with the RMS-DC converters described above utilizes a continuously interpolated attenuator such as those disclosed in U.S. Pat. Nos. 5,684,431 and 5,077,541, both by the inventor of the present application. In a system providing very wide dynamic range, the noise arising in the VGA will be comparable with the signal in certain situations. However, with a VGA having a continuously interpolated attenuator, the noise at the output is independent of the gain. This being the case, the signal-to-noise ratio at the output of the VGA is constant, and this may be factored out of the measurement by a simple technique in which the reference voltage $V_{REF}$ is increased slightly to account for the increased magnitude of the VGA output due to vector summation of the signal and noise.

In a practical implementation, the signal $S_{SQR}$ will typically include a noise component from the VGA which increases with the square root of temperature. However, the squaring cell squares the noise component, so it becomes proportional to temperature. This noise component can be anticipated and cancelled through vector summation by increasing the reference signal by an amount which is proportional to absolute temperature (PTAT). The reference signal then tracks the increase in noise with temperature, and the overall effect is to stabilize the intercept.

Figure 7:
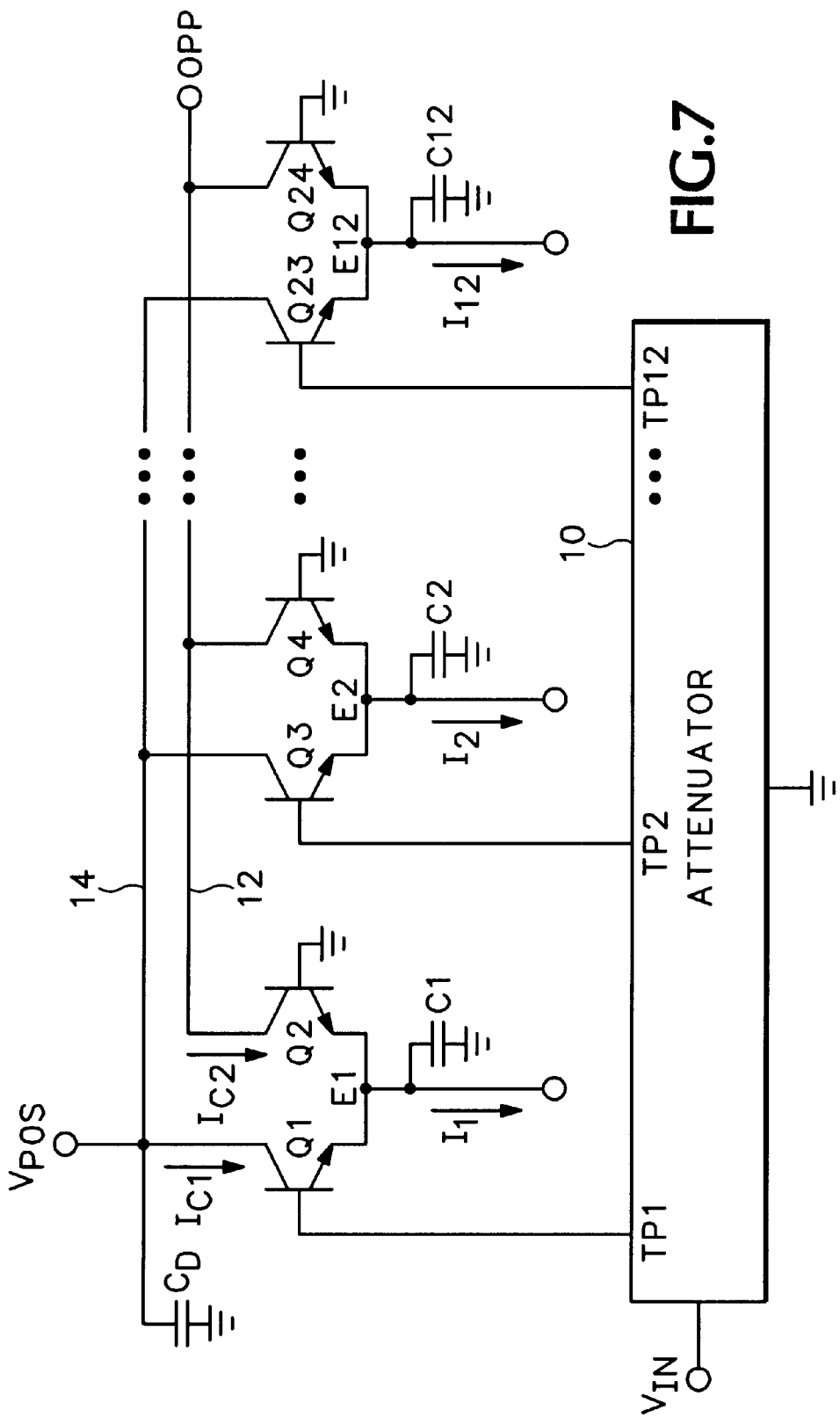
FIG. 7 is a simplified schematic diagram of an embodiment of an input system for a variable gain amplifier constructed in accordance with the present invention.

Another aspect of the present invention is an input system for a continuously interpolated amplifier wherein the current from one of the transistors in each gm stage in the input system is diverted to an AC ground through a feedforward path. An embodiment of such an input system in accordance with the present invention is shown in FIG. 7. The system shown in FIG. 7 includes twelve gm stages, but the invention can be realized with any number of stages.

The system of FIG. 7 includes an illustrative 12-section (12-tap) attenuator 10 having an input port for receiving an input signal $V_{IN}$ and a series of tap ports TP1–TP12 at which a progressively attenuated version of the input signal appears. The attenuator 10 is shown connected to a signal ground.

The system of FIG. 7 also includes a series of twelve gm stages coupled to the tap ports along the attenuator. Each gm stage includes a pair of transistors (Q1–Q2, Q3–Q4, etc.) having their emitters connected together at a common emitter node (E1, E2, etc.) for receiving an interpolator current ($I_1$, $I_2$, etc.) that controls the gain of each gm stage. In fact, the gm is proportional to these currents.

One of the transistors in each gm stage has its base connected to a tap port on the attenuator (TP1, TP2, etc.) and its collector connected to a bus 14 that is AC grounded. In the embodiment shown in FIG. 7, the AC ground bus is the positive power supply bus which receives the positive power supply voltage $V_{POS}$. A decoupling capacitor $C_D$ insures a low-impedance AC ground at $V_{POS}$. The other transistor in each pair has its base connected to an AC ground and its collector connected to an output bus 12 where the collector currents from all of the transistors having grounded bases are summed to generate the output signal OPP. Each gm stage also includes a capacitor (C1, C2, etc.) connected between the emitter node and AC ground. The output signal OPP is coupled to a main amplifier section where most of the gain arises.

Figure 8:
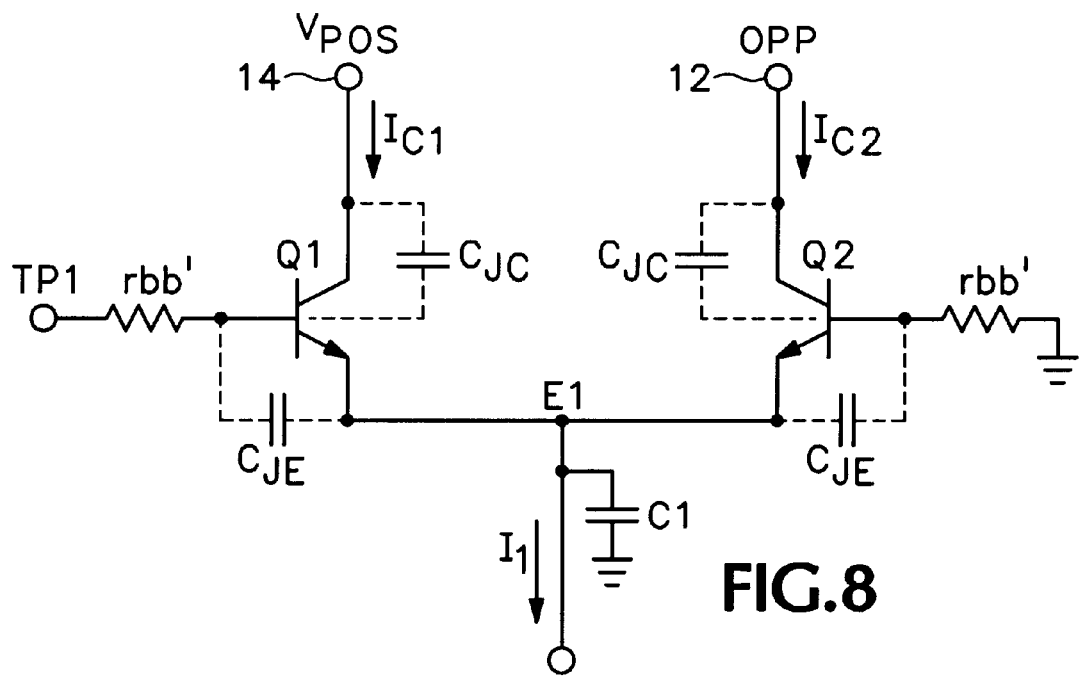
FIG. 8 is a schematic diagram of a representative gm cell of FIG. 7 showing parasitic capacitances and resistances.

The operation and advantages of the system of FIG. 7 can be better understood with reference to FIG. 8 which shows the collector-junction capacitance $C_{JC}$, emitter-junction capacitance $C_{JE}$, and base resistance rbb' associated with each of the transistors of the first gm stage of FIG. 7, which is representative of all the gm stages. Output currents $I_{C1}$ and $I_{C2}$ are generated at the collectors of Q1 and Q2 in response to their transconductances operating on the attenuated signal received at the base of Q1 from tap port TP1 of the attenuator. If the current collector $I_{C1}$ from Q1 were to be coupled to the main amplifier, a feedforward component of the attenuated signal would be transmitted to the main amplifier through the $C_{JC}$ of Q1. At low operating frequencies, this might be acceptable, but at gigahertz frequencies, it causes a very large feed-through of the signal directly to the output even when the gain control current $I_1$ is zero. However, by connecting the collectors of all of the input transistors to the positive power supply, this part of the signal is diverted harmlessly to an AC ground.

Another feedforward path exists from TP1 through the base resistance rbb' of Q1, the $C_{JE}$ of Q1, the $C_{JE}$ of Q2 and the $C_{JC}$ of Q2 to the output bus 12. Although the capacitances are typically on the order of femto Farads (fF), their low reactances are troublesome at high frequencies. However, capacitor C1, typically 1pF, strongly attenuates the feedforward signal through this path because the ratio of C1 to the $C_{JE}$ of Q1 is very large. By eliminating most of the feedforward signal from the attenuator to the main amplifier, the AC grounded collector connection and the attenuating capacitors allow this realization of a variable gain amplifier utilizing the input system of FIG. 7 to have a very flat frequency response from DC to several gigahertz when implemented with an appropriate process that provides transistors having suitable HF characteristics.

Figure 9:
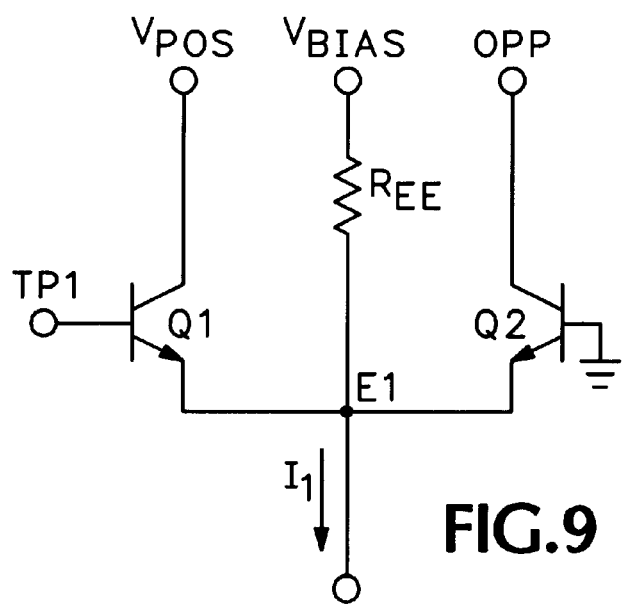
FIG. 9 shows an enhancement in accordance with the present invention for turning a gm stage completely off and reverse biasing its emitter node when its interpolator current is substantially zero.

FIG. 9 shows a modification to the gm stages of FIG. 7 which ensures that the gm stage turns completely off when the interpolator current falls to a low value. The currents $I_1$–$I_{12}$ generated by the interpolator have a Gaussian-like characteristic. That is, as the gain is swept from one extreme to the other, each interpolator current sequentially rises from a near zero value, to a maximum value, and then back down asymptotically to zero. However, in a practical embodiment, the interpolator currents do not fall exactly to zero, but continue to be provide a few nA to the gm stages that should be switched off. This has an insignificant effect on the gain because it is not enough current to cause those gm stages to have significant transconductance. However, this non-zero current causes a slight forward bias (about 400 or 500 mV) in the base-emitter junction. Since the emitter capacitance $C_{JE}$ increases with increasing forward bias, the residual interpolator currents through the gm stages that should be turned off cause an increase in the parasitic capacitances which increase signal current to flow through unwanted paths, thereby degrading the high frequency operation.

The circuit of FIG. 9 includes a resistor $R_{EE}$ connected between the emitter node E1 and a positive bias voltage source $V_{BIAS}$. When the interpolator current $I_1$ drops below a certain threshold, resistor $R_{EE}$ pulls the emitter node E1 up to a positive potential. This reverse biases the junctions, thereby decreasing the emitter capacitances to a very small value.

Figure 10:
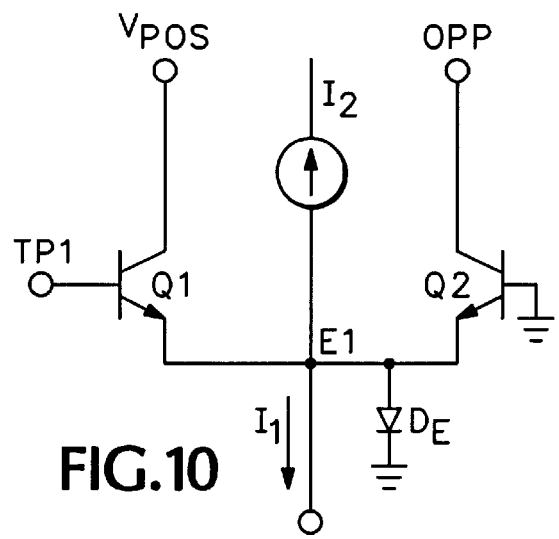
FIG. 10 shows another technique for reverse biasing the emitter node of a gm stage in accordance with the present invention.

Another technique for reverse biasing the emitter nodes of the gm stages that are off is shown in FIG. 10. The circuit of FIG. 10 includes a current source for applying a current $I_Z$ to node E1. The current $I_Z$, which is typically about 10 $\mu$A, works against the interpolator current $I_1$, which might typically be a few mA when at its full value. A diode $D_E$ is connected across the base-emitter junction of Q1 to prevent the reverse bias caused by $I_Z$ from damaging Q1.

Figure 11:
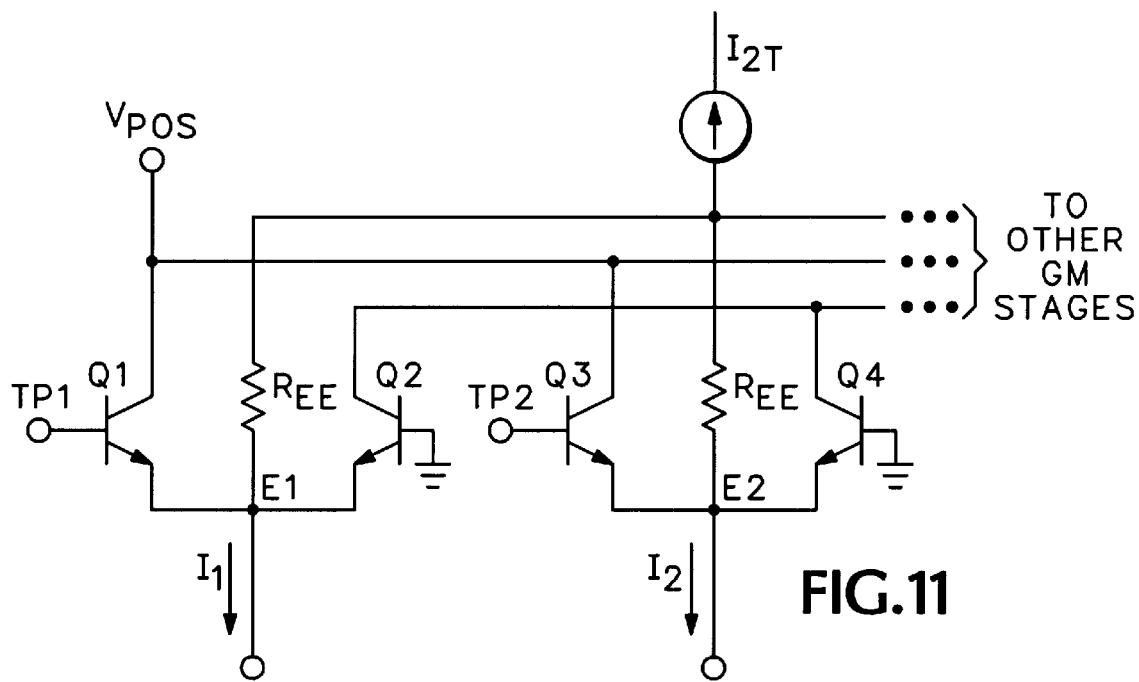
FIG. 11 shows yet another technique for reverse biasing the emitter node of a gm stage in accordance with the present invention.

Yet another technique for reverse biasing the emitter nodes of the gm stages that are off is shown in FIG. 11. The circuit of FIG. 11 includes a current source for supplying a current $I_{ZT}$ to all of the emitter nodes E1–E12 through resistors $R_{EE}$. This causes the emitter nodes of the gm stages that are off to rise to a voltage that is determined by the value of $I_{ZT}$ and $R_{EE}$. By selecting these values carefully, the emitter can be pulled up to a well-defined reverse potential that is higher than the simple $V_{BE}$ provided by the circuit of FIG. 10, but not so high as to damage Q1 and Q2 as might happen with the circuit of FIG. 9.

Figure 12:
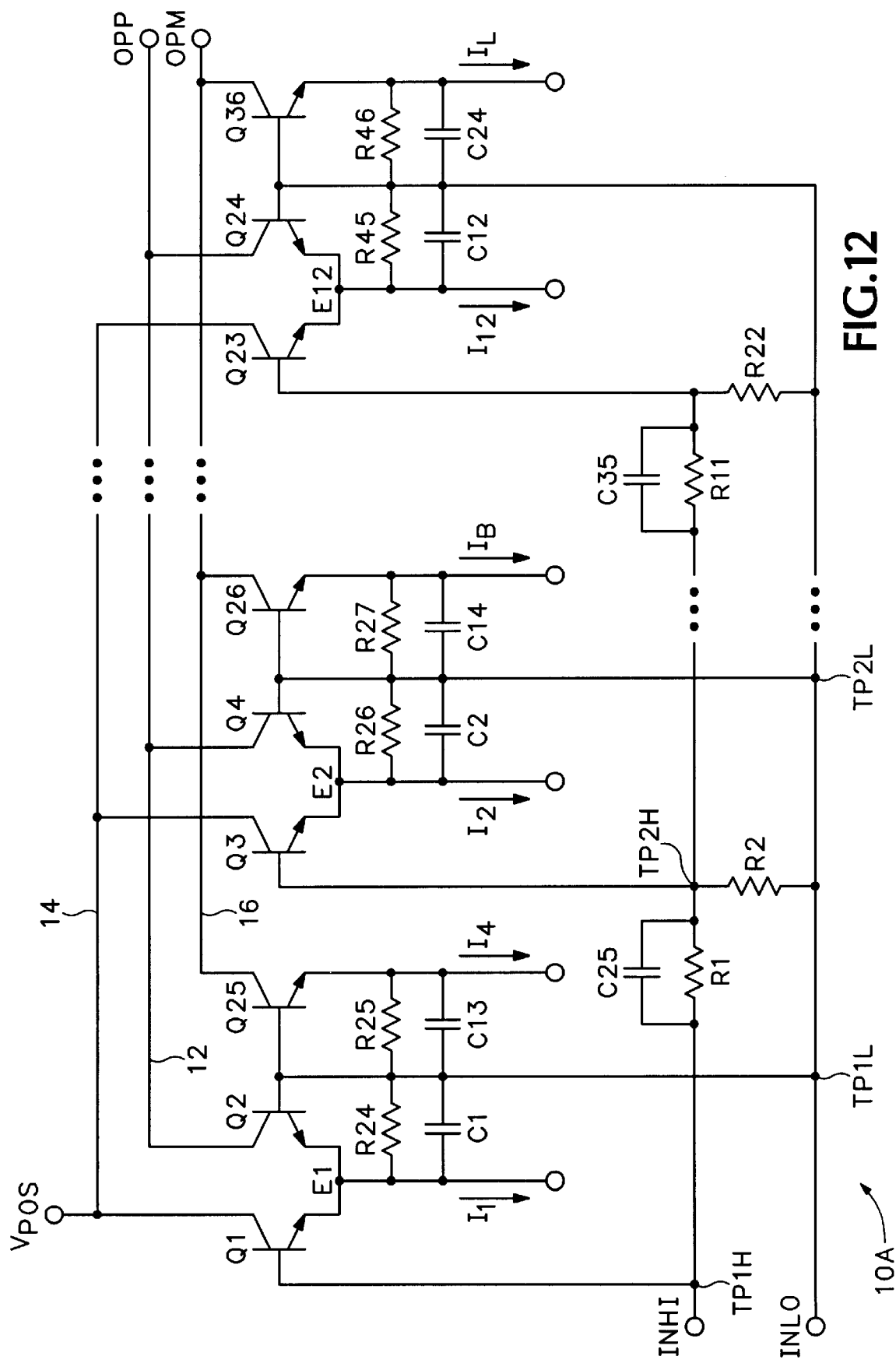
FIG. 12 is a schematic diagram of a practical embodiment of an input system for a variable gain amplifier showing additional enhancements in accordance with the present invention.

FIG. 12 is a schematic diagram of a practical embodiment of an input system for a variable gain amplifier showing additional enhancements in accordance with the present invention. The system of FIG. 12 is similar to that of FIG. 7, but each gm stage includes an additional compensation transistor (Q25–Q36) having its base connected to the AC ground at the base of the transistor whose collector is connected to the output bus, its collector connected to a second output bus 16, and its emitter coupled to the interpolator to receive a second interpolator current ($I_A$, $I_B$, etc.).

Therefore, the interpolator must be adapted to generate these additional interpolator currents. Transistors Q25–Q36 are preferably the same physical size as Q1–Q24 so they have the same $C_{JC}$. The output current from the collectors of the compensation transistors Q25–Q36 are summed at the second output bus to generate the second output signal OPM. The signals OPP and OPM are then coupled to a main amplifier having a differential input.

The input port of attenuator 10A includes first and second input terminals for receiving the input signal as INHI and INLO. Although the attenuator could be implemented as an R2R ladder to provide 6.026 dB of attenuation per tap, as is commonly done, the resistor values are preferably chosen to provide 6.70 dB per tap so as to provide a total gain range of about 80 dB in an amplifier having twelve gm stages. Each of the tap ports of the attenuator (TP1–TP12) includes a high tap point (TP1H–TP12H) for providing the attenuated signal and a low tap point (TP1L–TP12L) as a reference for the attenuated signal. In each gm stage, the base of the transistor having its collector AC grounded is connected to one of the high tap points, and the base of the grounded base transistor is connected to the bottom of the attenuator at a corresponding low tap point.

The bottom of the attenuator, i.e., the node that receives INLO, should be fabricated as a heavy duty bus bar to minimize its impedance. However, there is still resistance and inductance associated with the metalization for the bottom of the attenuator. Therefore, each low tap point should be physically close to the corresponding high tap point to take advantage of the common mode rejection of each gm stage.

Because the gm stages in the example system shown in FIG. 12 are constructed from NPN transistors, the bottom of the attenuator cannot be connected to true ground, but instead must be maintained at a high enough potential above ground to provide the interpolator with enough power supply "headroom" to supply the interpolation currents $I_1$–$I_{12}$ and $I_A$–$I_L$. A large decoupling capacitor should be connected between INLO and ground (or the IC pads that will be connected to system ground) to provide a "solid" AC ground at INLO. However, despite efforts to maintain the bottom of the attenuator as a low impedance node, it is still likely to have a common mode perturbation at high frequencies due to bondwire inductance. The perturbation signal can be fed forward to OPP and the main amplifier though the $C_{JC}$ of the grounded base transistors. This can be especially troublesome at the end of the attenuator farthest from the input port, because the perturbation signal can be bigger than the actual attenuated input signal.

This problem is alleviated by the compensation transistors Q25–Q36 which provide a feedforward component to OPM which is equal to the feedforward to OPP provided by Q2, Q4, etc. By using a main amplifier that has a differential input, the feedforward component is cancelled due to the common mode rejection of the main amplifier.

It is important to keep transistor pairs Q2/Q25, Q4/Q26, etc. well balanced. Therefore, capacitors C13–C24 are provided across the base-emitter junctions of Q25–Q36 to perform the same function as capacitors C1–C12. Resistors R24–R46 are connected across the base-emitter junctions of transistor pairs Q2/Q25, Q4/Q26, etc. to turn the transistors completely off when corresponding interpolator currents are substantially zero as discussed above. Resistors R25, R27, etc., which correspond to the compensation transistors, should be twice the resistance of R24, R26, etc. The interpolator currents $I_A$–$I_L$ to the compensation transistors should be half the value of the currents $I_1$–$I_{12}$ to the main transistor pairs.

Because the collectors of Q1, Q3, etc. are connected to an AC ground, the $C_{JC}$s of these transistors shunt some of the high frequency response of the attenuator. Therefore, capacitors C25–C36 are included across the transverse resistors R1, R3, etc. of the attenuator to compensate for this effect. The ratio of C25 to the $C_{JC}$ of Q3 should be in the same proportion as the DC attenuation provided by resistors R1 and R2.

Figure 13:
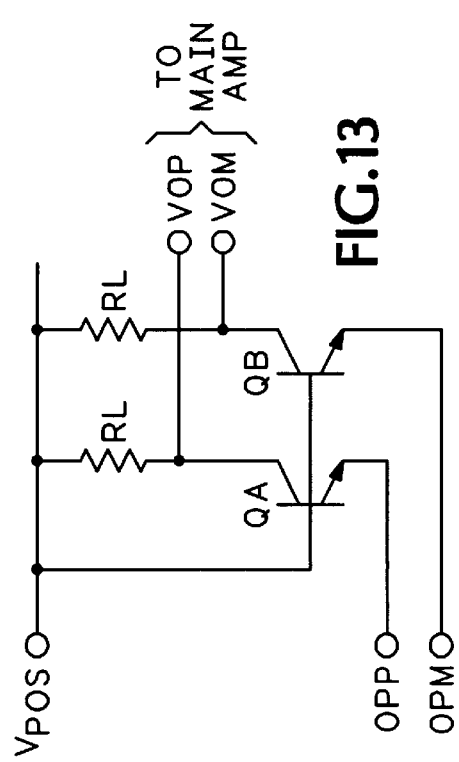
FIG. 13 shows an embodiment of a cascode stage for extending the bandwidth of a variable gain amplifier in accordance with the present invention.

To realize the full bandwidth potential of the present invention, a cascode stage such as that shown in FIG. 13 can be used between the gm stages and the main amplifier. Each of the signal bus lines 12 and 16 for OPP and OPM, respectively, is connected to twelve collectors which have significant capacitance. If these lines were taken directly to load resistors $R_L$, the time constant of the RC combination would lower the bandwidth considerably. However, by interposing cascode transistors QA and QB between the signal lines and the main amplifier, the large effective capacitance of the OPP and OPM lines is lowered. By making QA and QB physically small, the bandwidth is extended yet further. Another advantage of the cascode stage of FIG. 13 is that the $f_T$ of the cascode transistors effectively transforms their base resistances rbb' into inductances that interact with the total $C_{JC}$ to make a series resonant circuit that provides inductive peaking, thereby improving the high frequency operation.

Figure 14:
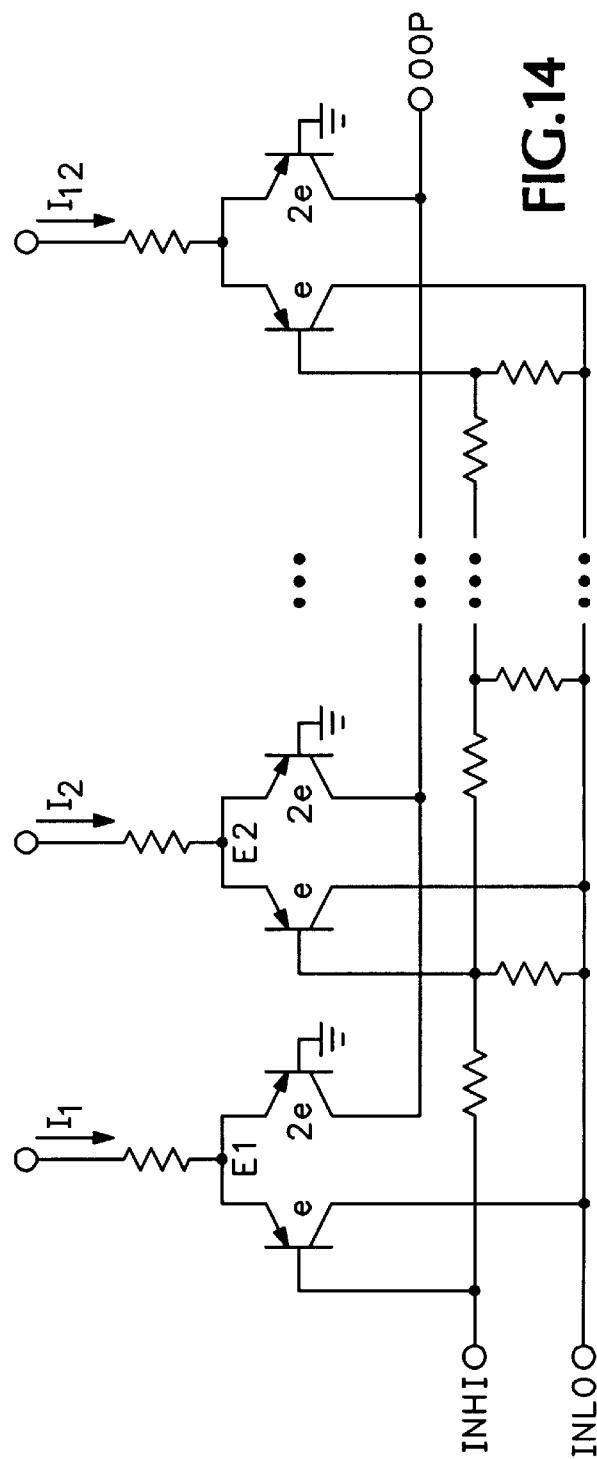
FIG. 14 is a schematic diagram of an embodiment of an input system using PNP transistors for the gm stages in accordance with the present invention.

FIG. 14 is a schematic diagram of an embodiment of an input system in accordance with the present invention using PNP transistors for the gm stages. The use of PNP transistors allows the bottom of the attenuator to be connected to the DC ground because the interpolator currents (I1, I2, etc.) are generated by an interpolator having current sources that source current from the positive power supply rail. The AC grounded collectors in the gm stages are now connected directly to the actual DC ground which can be made a very firm ground.

Although not shown in FIG. 14, the additional techniques discussed above for improving the bandwidth and accuracy of the input system can also be used with the system of FIG. 14, namely, the use of decoupling capacitors at the emitter nodes E1, E2, etc., the use of a third transistor in each gm stage to provide a differential output that cancels the feedforward signal through the $C_{JC}$, etc.

Although the embodiments described above are implemented with 12 gm stages, a different number of stages can be used depending on the specific system requirements. It should also be noted that the term transistor, as used herein, refers to any device having a control input for controlling the flow of current. Therefore, the term base refers to the base of a bipolar junction transistors (BJT) as well as the gate of a field effect transistor (FET). Since FET as well as BJT embodiments of the present invention are possible, terms specific to BJT transistors are understood to also refer to the corresponding FET elements, e.g., a base refers to a gate, a common emitter node refers to a common source node, a collector refers to a drain, etc.

Although the embodiments described above have gm stages with one transistor having a base connected to a firm AC ground, it is also possible to configure the bases to receive a feedback signal from the main amplifier, thereby providing closed loop operation.

Figure 15:
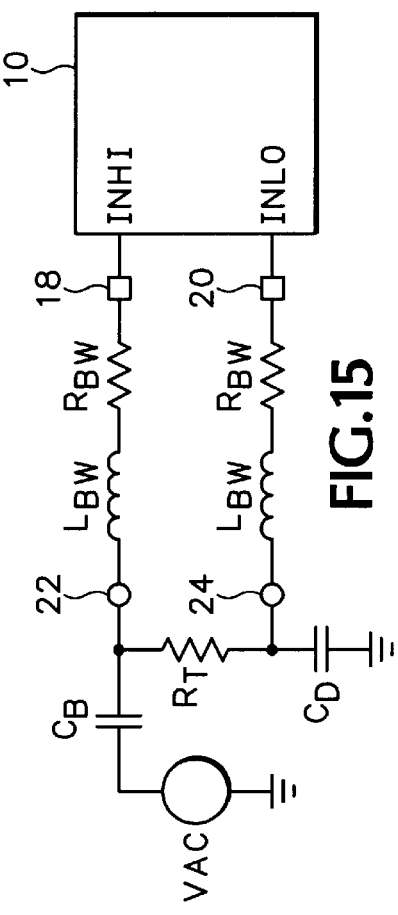
FIG. 15 illustrates a technique for reducing problems associated with bondwires in accordance with the present invention.

FIG. 15 illustrates a technique in accordance with the present invention for reducing problems associated with the bondwires that connect the attenuator to the pins of an IC package. FIG. 15 shows the input pads 18 and 20 on the integrated circuit for receiving the input signal INHI/INLO. $L_{BW}$ and $R_{BW}$ represent the inductance and resistance of the bondwires connecting the pads 18 and 20 to pins 22 and 24 of the IC package. By designing the input impedance of the attenuator 10 to be relatively high, for example, 200 ohms, the currents through the bondwires are reduced, as are the associated voltage perturbations at the input port of the attenuator. However, it is often necessary to present a characteristic input impedance of 50 ohms. Therefore, the user can connect a termination resistor $R_T$ of about 75 ohms across the input pins 22 and 24 to bring the input impedance back to about 50 ohms if necessary. Then, the currents flowing through $R_T$ flow harmlessly to ground through $C_D$ rather than flowing through the bondwires.

Figure 16:
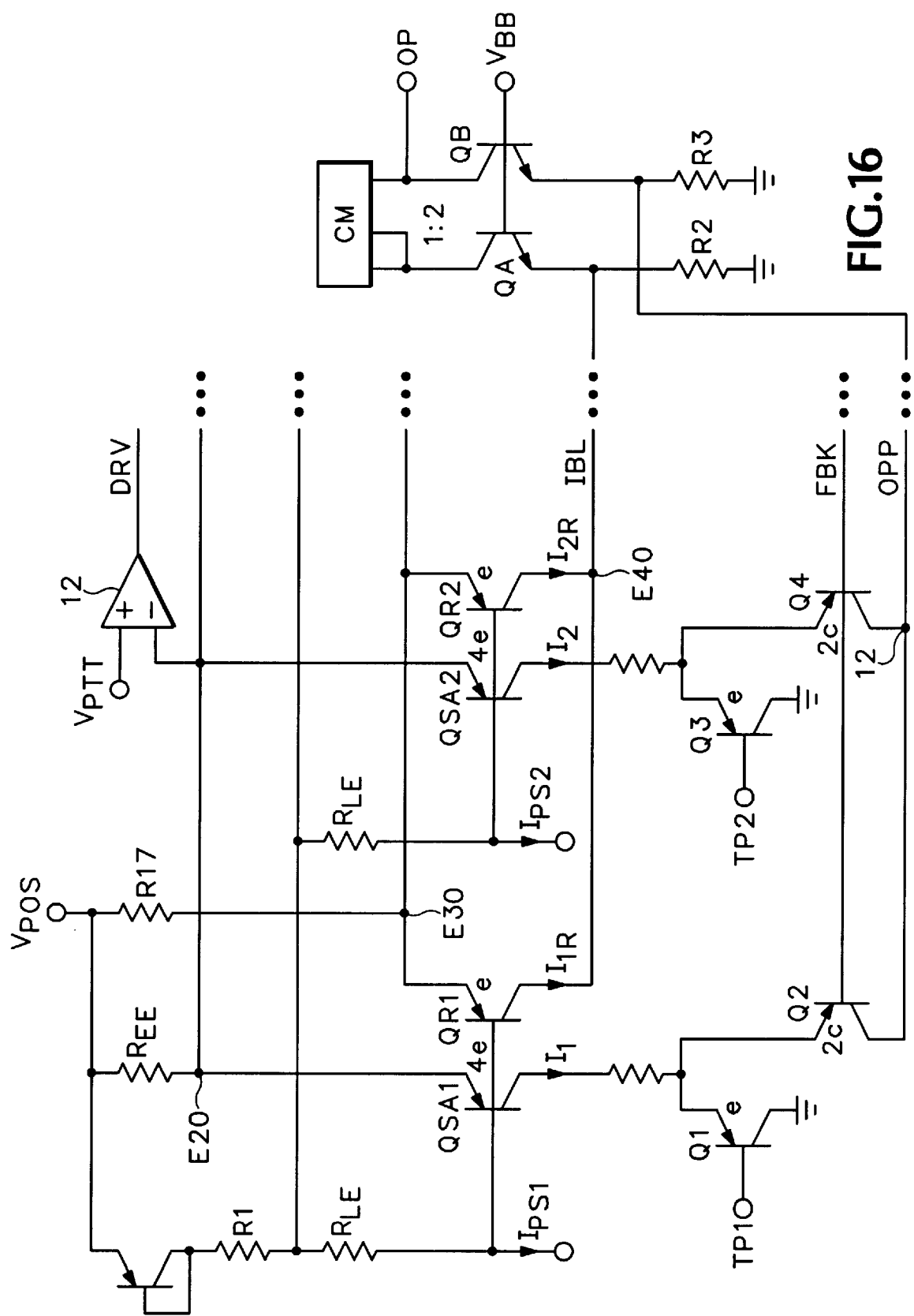
FIG. 16 is a schematic diagram of a scheme for interfacing an input system and interpolator in accordance with the present invention.

In a preferred embodiment, the interpolator used to generate the interpolator currents $I_1$–$I_{12}$ in FIGS. 7–12 and 14 and the currents $I_A$–$I_L$ in FIG. 12 is of the type described in co-pending U.S. patent application Ser. No. 09/466,050, filed Dec. 17, 1999 entitled "Interpolator Having Dual Transistor Ranks and Ratiometric Control" by the same inventor as the present application and which is incorporated by reference. FIG. 16 shows a preferred scheme for interfacing this type of interpolator to an input system in accordance with the present invention.

Referring to FIG. 16, the first two stages of the input system are shown as PNP transistor pairs Q1,Q2 and Q3,Q4. Only two stages are shown, but it is understood that any number of stages can be used. The second rank of transistors in the interpolator (the rank which performs the spatial amplification) are shown as PNP transistors QSA1 and QSA2 which are driven by the partially switched currents $I_{PS1}$ and $I_{PS2}$, respectively, from the first rank of transistors (not shown). The combined currents through the emitters of the spatial amplification transistors are summed at node E20 and flow through resistor $R_{EE}$. A biasing arrangement including op amp 12 monitors the voltage at node E2 and servoes the system by driving the voltage at the common emitter node of the first rank of transistors so as to maintain the current through $R_{EE}$ at a constant value.

The spatial amplification transistors QSA1 and QSA2 provide interpolator currents $I_1$ and $I_2$ which bias the gm stages Q1,Q2 and Q3,Q4, respectively. The bases of transistors Q1 and Q3 are driven by the signals TP1 and TP2, respectively, from the attenuator, and their collector currents are diverted to a suitable AC ground. The collectors of Q2 and Q4 are connected together at node 12 from which the output signal OPP is taken. The bases of Q2 and Q4 are connected together and receive a feedback signal FBK from the main amplifier.

The biasing scheme used in the interpolator tends to generate some uncorrelated noise in the output currents from the interpolator. In most applications, this noise is tolerable. However, when used with the input section of the present invention, the noise can be problematic due to the asymmetric nature of the gm stages which are driven by the interpolator currents because half of this noise in the interpolator currents is coupled through to the outputs of Q2 and Q4.

Therefore, the system of FIG. 16 includes replication transistors QR1 and QR2 for generating currents $I_{1R}$ and $I_{2R}$ which are replicas of the interpolator currents $I_1$ and $I_2$, respectively. These replica currents are summed at node E40 to generate the signal IBL which is used to drive one leg of a folded cascode arrangement built around transistors QA and QB. The output signal OPP is applied to the other leg, and in this manner, the noise current is fully correlated when it reaches the output OP from the cascode.

Figure 17:
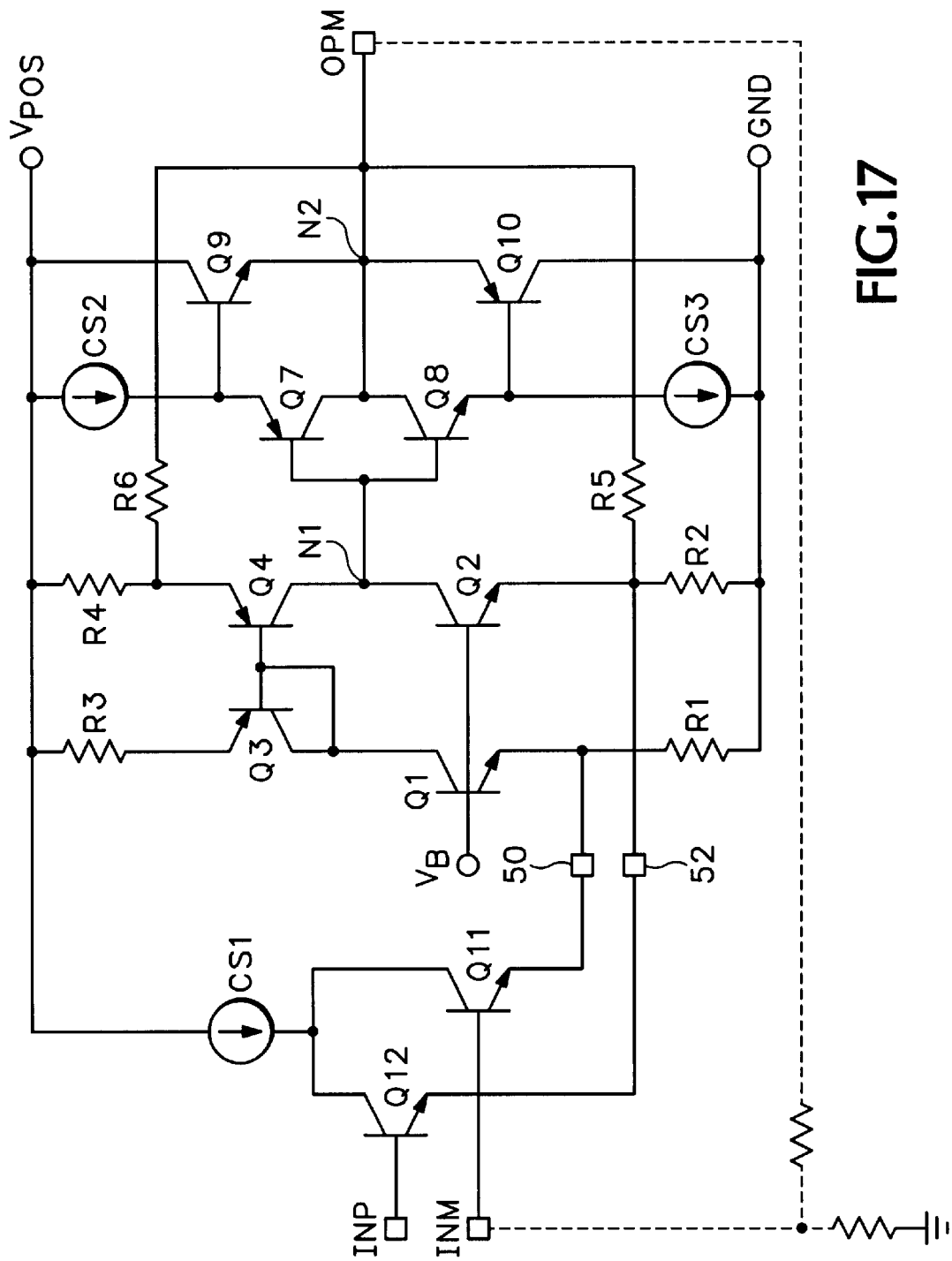
FIG. 17 is a schematic diagram of an embodiment of an operational amplifier having feedback compensation for extending bandwidth in accordance with the present invention.

FIG. 17 is a schematic diagram of an embodiment of an operational amplifier in accordance with the present invention suitable for use as the main amplifier for a VGA having an input system and a continuously interpolated attenuator as described above. Although the amplifier of FIG. 17 is suitable for use in this application, it has utility in many other situations and is not limited in any way to use with the VGAs described herein.

The amplifier of FIG. 17 is shown with a gm stage at the input as this would be a typical front-end for the amplifier; however, other input stages can be used. The gm stage includes a differential pair of transistors Q11 and Q12 which receive the differential input signals INP,INM at their bases, and a current source CS1 which biases Q11 and Q12. Transistors Q11 and Q12 are loaded by resistors R1 and R2, respectively, which also serve to establish the bias currents in cascode transistors Q1 and Q2. A bias voltage $V_B$ serves as an anchor for the bases of Q1 and Q2 which are loaded by a current mirror formed from transistors Q3 and Q4 and degeneration resistors R3 and R4. In a preferred embodiment, resistors R1 and R2 have a lower resistance than R3 and R4 so that the quiescent voltage across R1 and R2 is about the same as that across R3 and R4 after accounting for the extra current through R1 and R2 due to the differential pair Q11 and Q12. Current sources and loads other than resistors can be used for R1–R4. Transistors Q1–Q4 and resistors R1–R4 collectively form an intermediate stage.

If the amplifier of FIG. 17 is used as the main amplifier for the arrangement shown in FIG. 16, the front-end gm stage in FIG. 17 is omitted, and the signals IBL and OPP in FIG. 16 are coupled to terminals 50 and 52 in FIG. 17.

The collectors of Q2 and Q4 are connected together at node N1 which is also connected to the bases of complementary emitter-follower transistors Q7 and Q8. The emitter of Q8 is connected to GND through a current source CS3, and the emitter of Q9 is connected to $V_{POS}$ through current source CS2. The collectors of Q7 and Q8 could be connected to GND and $V_{POS}$, respectively; however, by collecting them together at the output node N2, the effects of the collector-base junction capacitances of Q7 and Q8 are cancelled, thereby improving the performance of the amplifier.

The final output signal OPM is generated at node N2 by transistors Q9 and Q10 which have their emitters connected together at node N2 and their bases connected to the emitters of Q7 and Q8, respectively. The collectors of Q9 and Q10 are connected to $V_{POS}$ and GND, respectively. Transistors Q7–Q10 and current sources CS2 and CS3 collectively form an output stage. The output node N2 would typically be connected back to the input of the gm stage through some type of feedback network as shown in broken lines in FIG. 17, although this is not a necessary requirement of the amplifier. The output signal OPM can be taken directly from node N2, but in some applications, an additional buffer amplifier may be needed.

The Early voltages of Q2 and Q4 effectively act as a resistor from node N1 to GND and prevents the node from swinging freely in response to a change in the input signal, thereby reducing the voltage gain of the amplifier. To compensate for this Early voltage effect, a feedback network formed from resistor R5 is connected between the output node N2 and the emitter of Q2. The value of R5 is preferably selected to equal the equivalent resistance value between node N1 and GND due to the Early voltage. Resistor R5 provides the current that is absorbed by this effective resistance as the voltage at node N1 changes in response to the input signal. Node N2 can easily supply the current through R5 because it has a relatively low impedance as compared to node N1. Thus, the DC gain error due to the Early voltages of Q2 and Q4 is eliminated, and the DC gain is typically extended by about 20–30 dB.

In a preferred embodiment, the feedback network also includes another feedback resistor R6, which is connected between N2 and the emitter of Q4 to balance the system and eliminate any DC current offset due to lack of symmetry. In this case, R5 and R6 should each have twice the equivalent resistance caused by the Early voltage.

In the system of FIG. 17, node N1 has a parasitic capacitance due mainly to the collector junction capacitances of Q2 and Q4. The junction capacitance "C" works against the transconductance (gm) of the input stage to set the open loop corner frequency which is given by gm/C. To compensate for this junction capacitance, the feedback network in the system of FIG. 18 includes diode-connected transistors Q5 and Q6 which are made identical to Q2 and Q4, respectively, for the purpose of matching the junction capacitances of Q2 and Q4. Transistor Q5 is connected between the emitters of Q8 and Q2, while transistor Q6 is connected between the emitters of Q7 and Q4. Since the voltage $V_{BE}$ across the base-emitter junctions of Q2 and Q8 are about the same, the collector-base voltage across Q2 and Q5 will track in terms of both the supply voltage and signal voltage, so the collector junction capacitances of Q2 and Q5 will also track, thereby canceling the junction capacitances. Likewise, the collector junction voltages of Q4 and Q6 will track, thereby canceling the junction capacitance of Q4.

In a typical amplifier fabricated with a modern complementary bipolar process, the capacitance cancellation technique described above can increase the bandwidth of an amplifier from about 500 MHz to about 2 GHz. The capacitance cancellation technique illustrated in FIG. 18 can be used independently of, or in combination with, the Early voltage compensation technique illustrated in FIG. 17.

Figure 18:
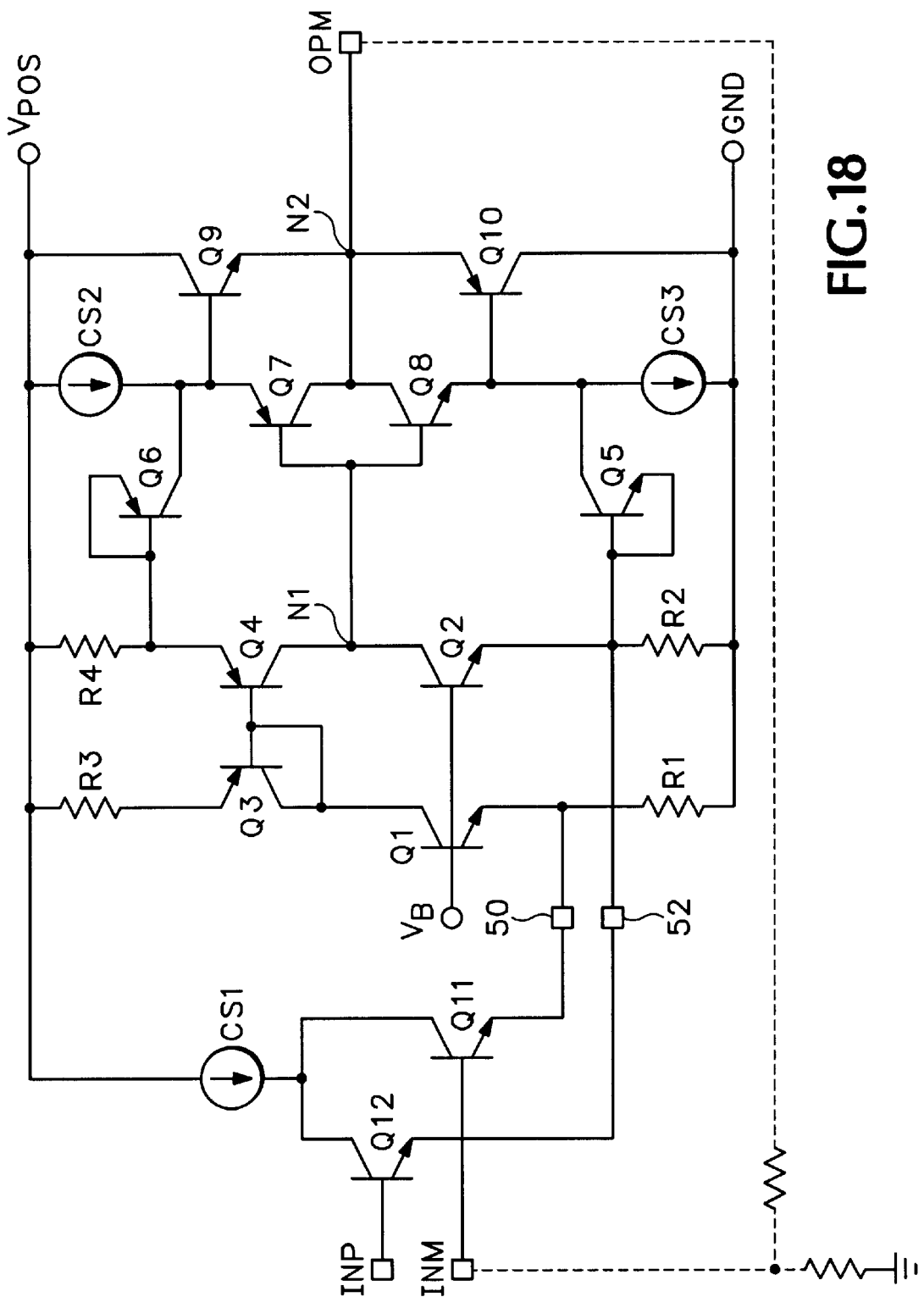
FIG. 18 is a schematic diagram of an embodiment of an operational amplifier utilizing a scheme for compensating for junction capacitance in accordance with the present invention.
Figure 19:
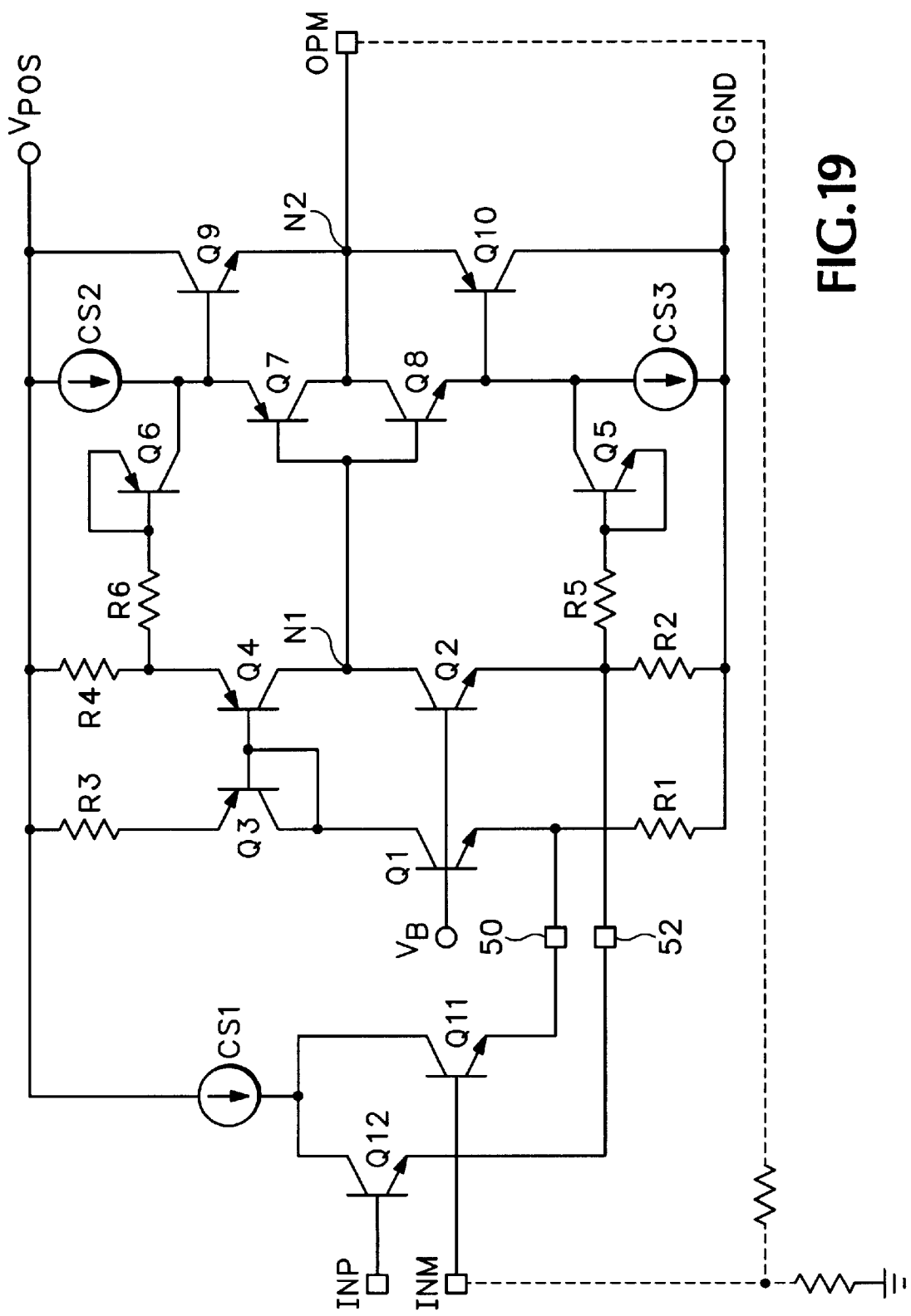
FIG. 19 is a schematic diagram of an embodiment of an operational amplifier utilizing a scheme for extending bandwidth in accordance with the present invention.

FIG. 19 is a shows a preferred embodiment of an amplifier in accordance with the present invention. The system of FIG. 19 is in most respects the same as those of FIGS. 17 and 18, however, in the system of FIG. 19, resistor R5 and diode-connected transistor Q5 are connected in series between the emitters of Q8 and Q2, while resistor R6 and diode-connected transistor Q6 are connected in series between the emitters of Q7 and Q4.

Transistors Q5 and Q6 are used primarily as capacitors in the systems of FIGS. 17–19. However, they need not be transistors or even diodes, but any capacitance which can be made to mach the junction capacitances sought to be cancelled. Using transistors that are identical to Q2 and Q4 will typically be the easiest way to assure that the capacitances will match. Again, these techniques are not limited to bipolar implementations, but are also applicable to CMS and any other appropriate technology.

Having described and illustrated the principles of the invention in a preferred embodiment thereof, it should be apparent that the invention can be modified in arrangement and detail without departing from such principles. For example, the circuits described above are shown with transistors of the polarity that is most likely to be used in a practical embodiment, i.e., PNP or NPN devices. However, in most cases, the circuits can be realized using devices of the opposite polarity. Also, the circuits described above are shown with bipolar junction transistors (BJTs), but any current control other devices such as field effect transistors can be used as well. As used herein, transistor refers to any current control device having a control terminal. Thus, grounded base would refer to grounded gate in an FET, and so on. I claim all modifications and variations coming within the spirit and scope of the following claims.

What is claimed is:

1. An input system for a variable gain amplifier comprising:
    an attenuator having an input port for receiving an input signal and a plurality of tap ports for generating a plurality of attenuated signals responsive to the input signal; and
    a plurality of gm stages, each gm stage coupled to one of the tap ports to receive one of the attenuated signals;
    wherein each of the gm stages includes a transistor cell for generating two output currents responsive to the attenuated signal, and a node for receiving one of a plurality of interpolator signals for controlling the gain of the transistor cell; and
    wherein a first one of the output currents from each gm stage is coupled to an AC ground.

2. A system according to claim 1 wherein each gm stage further includes a filter coupled to the node.

3. A system according to claim 1 wherein the second output currents from the gm stages are combined to generate a first main output signal, and wherein the system further includes a compensation transistor coupled to a common terminal of the attenuator to generate a second main output signal responsive to the common mode voltage of the common terminal.

4. A system according to claim 1 wherein:
    the second output currents from the gm stages are combined to generate a first main output signal;
    each gm stage further includes a compensation transistor coupled to a corresponding one of the tap ports for generating a third output current responsive to the common mode voltage of the tap port; and
    the third output currents from the gm stages are combined to generate a second main output signal.

5. A system according to claim 4 wherein each gm stage further includes a filter coupled to the compensation transistor.

6. A system according to claim 4 wherein each gm stage further includes means for turning the compensation transistor completely off when the corresponding interpolator signal is substantially off.

7. A system according to claim 1 wherein the second output currents from the gm stages are combined to generate a first main output signal, and further including a cascode stage coupled to receive the first main output signal.

8. A system according to claim 4 further including a cascode stage coupled to receive the first and second main output signals.

9. A system according to claim 1 wherein:
    the input impedance of the attenuator at the input port is relatively high;
    the input port of the attenuator includes first and second input terminals;
    the first input terminal is coupled to a first pin through a first bondwire to receive the input signal;
    the second input terminal is coupled to a second pin through a second bondwire; and
    the system further includes a termination impedance coupled between the first and second pins.

10. A system according to claim 1 wherein each gm stage further includes means for turning the gm stage completely off when the corresponding interpolator signal is substantially off.

11. A system according to claim 10 wherein the means for turning the gm stage completely off includes a current source coupled to the node to cancel a portion of the interpolator signal.

12. A system according to claim 11 wherein the means for turning the gm stage completely off further includes a resistor coupled between the current source and the node to provide a defined reverse bias to the transistor cell.

13. A system according to claim 10 wherein the means for turning the gm stage completely off includes a resistor coupled between the node and a power supply terminal.

14. A system according to claim 13 wherein the means for turning the gm stage completely off further includes a diode coupled between the node and an input terminal of one of the transistors of the transistor cell to prevent excessive reverse bias on the one transistor.

15. A system according to claim 1 wherein:
each tap port of the attenuator includes a first tap point; and
each transistor cell includes a first transistor having a base coupled to the first tap point of the corresponding tap port, an emitter coupled to the node, and a collector coupled to an AC ground for coupling the first output current thereto.

16. A system according to claim 15 wherein each transistor cell further includes a second transistor having a base coupled to an AC ground, an emitter coupled to the node, and a collector coupled an output bus for coupling the second output current thereto.

17. A system according to claim 16 wherein the base of the second transistor of each transistor cell is coupled to receive a feedback signal.

18. A system according to claim 16 wherein each gm stage further includes a capacitor coupled between the node and an AC ground.

19. A system according to claim 16 wherein each gm stage further includes a resistor coupled between the node and an AC ground.

20. A system according to claim 16 wherein each gm stage further includes a third transistor having a base coupled to the base of the second transistor, an emitter coupled to receive one of a second plurality of interpolator signals, and a collector coupled to a second output bus.

21. A system according to claim 20 further including:
a first cascode transistor coupled to the first output bus; and
a second cascode transistor coupled to the second output bus.

22. A system according to claim 20 wherein the second and third transistors of each gm stage have the same collector-junction capacitance.

23. A system according to claim 15 wherein:
each tap port of the attenuator includes a second tap point that is AC grounded;
the base of the second transistor in each gm stage is coupled to the second tap point of the corresponding tap port; and
the first and second tap points of each tap port are located physically close.

24. A system according to claim 23 wherein the second tap points of the attenuator are coupled together at a heavy-duty bus bar which forms the bottom of the attenuator.

25. A method of operating an input stage for a variable gain amplifier, the input stage comprising: an attenuator having an input port for receiving an input signal and a plurality of tap ports for generating a plurality of attenuated signals responsive to the input signal; and a plurality of gm stages, each gm stage coupled to one of the tap ports to receive one of the attenuated signals; wherein each of the gm stages includes a transistor cell for generating two output currents responsive to the attenuated signal, and a node for receiving one of a plurality of interpolator signals for controlling the gain of the transistor cell; the method comprising:
diverting a first one of the output currents from each gm stage to an AC ground.

26. A method according to claim 25 further including attenuating a feedforward signal at the node.

27. A method according to claim 26 wherein attenuating the feedforward signal at the node includes coupling a filter to the node, thereby forming a divider with a parasitic capacitor of the transistor cell.

28. A method according to claim 25 wherein:
a second one of the output currents from each gm stage are combined at an output terminal to form an output signal, whereby a feedforward signal is coupled from the node of each gm stage to the output terminal; and
the method further includes coupling a substantially identical feedforward signal from the node of at least one of the gm stages to a second output terminal, thereby generating the output signal as a differential signal having the feedforward signal as a common mode component of the differential signal.

29. A method according to claim 28 wherein coupling a substantially identical feedforward signal to the second output terminal includes coupling a compensation transistor between the node of one of the gm stages and the second output terminal.

30. A method according to claim 25 further including turning each gm stage completely off when the corresponding interpolator signal is substantially off.

31. A method according to claim 30 further including reverse biasing each gm stage when the corresponding interpolator signal is substantially off.

32. A method according to claim 25 further including shunting the input port of the attenuator with a termination impedance, thereby reducing the input current to the attenuator.

33. An input system for a variable gain amplifier comprising:
means for generating a plurality of attenuated signals responsive to an input signal; and
a plurality of means for generating two output currents responsive to one of the attenuated signals and one of a plurality of interpolator signals;
wherein each of the means for generating two output currents is arranged to divert one of the output currents to an AC ground.

34. A system according to claim 33 further comprising a plurality of means for attenuating a feedforward signal through each of the means for generating two output currents.

35. A system according to claim 34 wherein the means for attenuating is a capacitor.

36. A system according to claim 33 further comprising a plurality of means for generating a third output current responsive to the common mode voltage of one of the interpolator signals.

37. A system according to claim 36 wherein:
each of the means for generating two output currents comprises a differential pair of transistors having a node arranged to receive one of the interpolator signals; and each of the means for generating a third output current is a compensation transistor coupled to the node.

38. An input system for a variable gain amplifier comprising:

an attenuator having an input port for receiving an input signal and a plurality of tap ports for generating a plurality of attenuated signals responsive to the input signal; and a plurality of gm stages, each gm stage coupled to one of the tap ports to receive one of the attenuated signals;

wherein each of the gm stages includes a transistor cell for generating two output currents responsive to the attenuated signal, and a node for receiving one of a plurality of interpolator signals for controlling the gain of the transistor cell; and wherein each of the gm stages further includes a filter coupled to the node.

39. A system according to claim 38 wherein the filter is a capacitor.

40. A system according to claim 38 wherein the second output currents from the gm stages are combined to generate a first main output signal.

41. An input system for a variable gain amplifier comprising:

an attenuator having an input port for receiving an input signal and a plurality of tap ports for generating a plurality of attenuated signals responsive to the input signal; and a plurality of gm stages, each gm stage coupled to one of the tap ports to receive one of the attenuated signals;

wherein each of the gm stages includes a transistor cell for generating two output currents responsive to the attenuated signal, and a node for receiving one of a plurality of interpolator signals for controlling the gain of the transistor cell; and wherein each of the gm stages further includes means for attenuating a feedforward signal through the transistor cell.

42. An input system for a variable gain amplifier comprising:

an attenuator having an input port for receiving an input signal and a plurality of tap ports for generating a plurality of attenuated signals responsive to the input signal; and a plurality of gm stages, each gm stage coupled to one of the tap ports to receive one of the attenuated signals;

wherein each of the gm stages includes a transistor cell for generating two output currents responsive to the attenuated signal, and a node for receiving one of a plurality of interpolator signals for controlling the gain of the transistor cell; and wherein each of the gm stages further includes a compensation transistor coupled to a corresponding one of the tap ports and arranged to generate a third current responsive to the common mode voltage of the tap port.

43. A system according to claim 42 wherein:

the second output currents from the gm stages are combined to generate a first main output signal; and the third output currents from the gm stages are combined to generate a second main output signal.

44. An input system for a variable gain amplifier comprising:

an attenuator having an input port for receiving an input signal and a plurality of tap ports for generating a plurality of attenuated signals responsive to the input signal;

a plurality of gm stages, each gm stage coupled to one of the tap ports to receive one of the attenuated signals, wherein the gm stages are arranged to generate a first main output signal responsive to the attenuated signals and a plurality of interpolator signals; and a main amplifier having a first input coupled to receive the first main output signal and a second input coupled to receive a second main output signal;

wherein each of the gm stages fuirther includes means for providing a feedforward component to the second main output signal which is equal to a feedforward component of the first main output signal.

45. A system according to claim 44 wherein the means for providing a feedforward component comprises a compensation transistor coupled to one of the tap ports for receiving the attenuated signal.

* * * * *

UNITED STATES PATENT AND TRADEMARK OFFICE
CERTIFICATE OF CORRECTION

PATENT NO. : 6,525,601 B2  Page 1 of 1
DATED : February 25, 2003
INVENTOR(S) : Gilbert It is certified that error appears in the above-identified patent and that said Letters Patent is hereby corrected as shown below:

Column 13,
Line 15, "loop comer frequency" should read -- loop corner frequency --.

Column 18,
Line 34, "stages fuirther includes" should read -- stages further includes --.

Signed and Sealed this

Fifteenth Day of June, 2004

JON W. DUDAS
*Acting Director of the United States Patent and Trademark Office*